United States Patent
Miki

(10) Patent No.: US 10,230,029 B2
(45) Date of Patent: *Mar. 12, 2019

(54) LIGHT EMITTING DEVICE AND METHOD OF MANUFACTURING THE SAME

(71) Applicant: NICHIA CORPORATION, Anan-shi, Tokushima (JP)

(72) Inventor: Tomohide Miki, Tokushima (JP)

(73) Assignee: NICHIA CORPORATION, Anan-Shi (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/932,184

(22) Filed: Feb. 16, 2018

(65) Prior Publication Data

US 2018/0182938 A1 Jun. 28, 2018

Related U.S. Application Data

(60) Continuation of application No. 15/017,997, filed on Feb. 8, 2016, now Pat. No. 9,929,324, which is a
(Continued)

(30) Foreign Application Priority Data

Jun. 27, 2013 (JP) ................................ 2013-135229
Sep. 5, 2013 (JP) ................................ 2013-184078

(51) Int. Cl.
*H01L 33/56* (2010.01)
*H01L 33/54* (2010.01)
(Continued)

(52) U.S. Cl.
CPC .............. *H01L 33/56* (2013.01); *H01L 33/46* (2013.01); *H01L 33/50* (2013.01); *H01L 33/54* (2013.01);
(Continued)

(58) Field of Classification Search
CPC .......... H01L 33/56; H01L 33/46; H01L 33/50; H01L 33/54
See application file for complete search history.

(56) References Cited

U.S. PATENT DOCUMENTS 9,287,472 B2 * 3/2016 Miki ....................... H01L 33/54
9,929,324 B2 * 3/2018 Miki ....................... H01L 33/56
(Continued)

FOREIGN PATENT DOCUMENTS

EP 1612021 A1 1/2006
JP 2002-335020 A 11/2002
(Continued)

OTHER PUBLICATIONS

Non-Final Office Action for U.S. Appl. No. 14/316,546 dated May 22, 2015.
(Continued)

*Primary Examiner* — John P. Dulka
(74) *Attorney, Agent, or Firm* — Foley & Lardner LLP

(57) ABSTRACT

There is provided a light emitting device including a light emitting element, a covering member for covering a side surface of the light emitting element, and a light-transmissive member disposed on upper surfaces in a light emitting direction of the light emitting element and the covering member and having an end face on substantially the same plane as an end face of the covering member, wherein the covering member has a recess portion or a convex portion on the upper surface, a light emitting surface of the light emitting element and an upper surface other than the recess portion or the convex portion of the covering member are arranged on substantially the same plane, and the light-transmissive member is provided in contact with the recess portion or the convex portion.

22 Claims, 8 Drawing Sheets

Related U.S. Application Data division of application No. 14/316,546, filed on Jun. 26, 2014, now Pat. No. 9,287,472.

(51) Int. Cl.
*H01L 33/46* (2010.01)
*H01L 33/50* (2010.01)

(52) U.S. Cl.
CPC ............... *H01L 2224/16245* (2013.01); *H01L 2924/181* (2013.01); *H01L 2924/1815* (2013.01); *H01L 2933/005* (2013.01); *H01L 2933/0025* (2013.01); *H01L 2933/0041* (2013.01)

(56) References Cited

U.S. PATENT DOCUMENTS

| | | | |
|---|---|---|---|
| 2010/0264438 A1* | 10/2010 | Suenaga | H01L 33/58 257/98 |
| 2011/0133362 A1 | 6/2011 | Sanada et al. | |
| 2012/0018772 A1 | 1/2012 | Nishijima et al. | |
| 2012/0267671 A1 | 10/2012 | Jung et al. | |
| 2012/0319563 A1* | 12/2012 | Ishihara | H01L 33/505 313/498 |
| 2013/0056781 A1 | 3/2013 | Suenaga | |
| 2013/0313602 A1 | 11/2013 | Suenaga | |

FOREIGN PATENT DOCUMENTS

| | | |
|---|---|---|
| JP | 2006 048860 A | 2/2006 |
| JP | 2007-317816 A | 12/2007 |
| JP | 2010-192629 A | 9/2010 |
| JP | 2010-238846 A | 10/2010 |
| JP | 2010-272847 A | 12/2010 |
| JP | 2010-283281 A | 12/2010 |
| JP | 2010-283311 A | 12/2010 |
| JP | 2011-066193 A | 3/2011 |
| JP | 2012-038999 A | 2/2012 |
| JP | 2012-195435 A | 10/2012 |
| JP | 2012-227511 A | 11/2012 |
| JP | 2012-248672 A | 12/2012 |
| JP | 2012-253223 A | 12/2012 |
| JP | 2013-004802 A | 1/2013 |
| JP | 2013-012544 A | 1/2013 |
| JP | 2013-071382 A | 4/2013 |
| JP | 2013-077679 A | 4/2013 |
| JP | 2013-251417 A | 12/2013 |
| WO | WO-2010/023907 A | 3/2010 |
| WO | WO-2011/052672 A1 | 5/2011 |
| WO | WO-2013/137356 A1 | 9/2013 |

OTHER PUBLICATIONS

Notice of Allowance for U.S. Appl. No. 14/316,546 dated Nov. 9, 2015.
Office Action issued in Japanese Patent Application No. 2013-135229 dated Jan. 31, 2017.
Office Action issued in Japanese Patent Application No. 2013-184078 dated Jan. 31, 2017.
Non-Final Office Action for U.S. Appl. No. 15/017,997 dated Jul. 14, 2017.
Notice of Allowance for U.S. Appl. No. 15/017,997 dated Nov. 17, 2017.

* cited by examiner

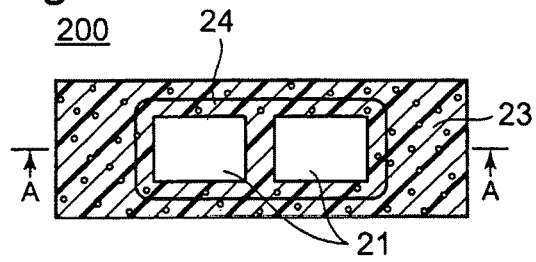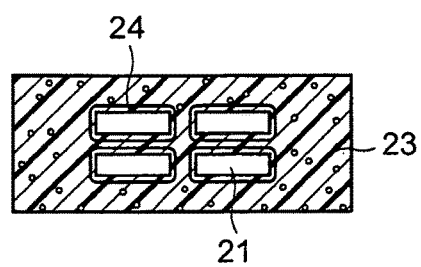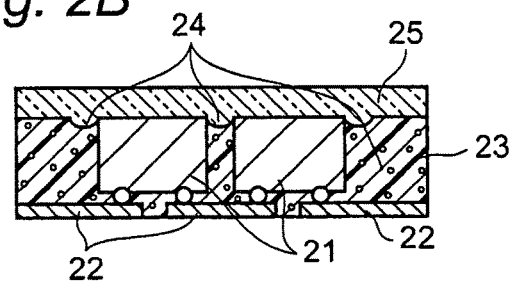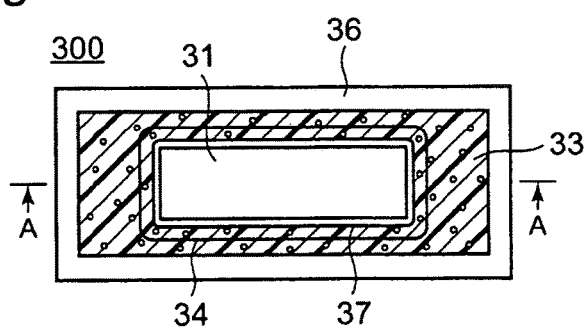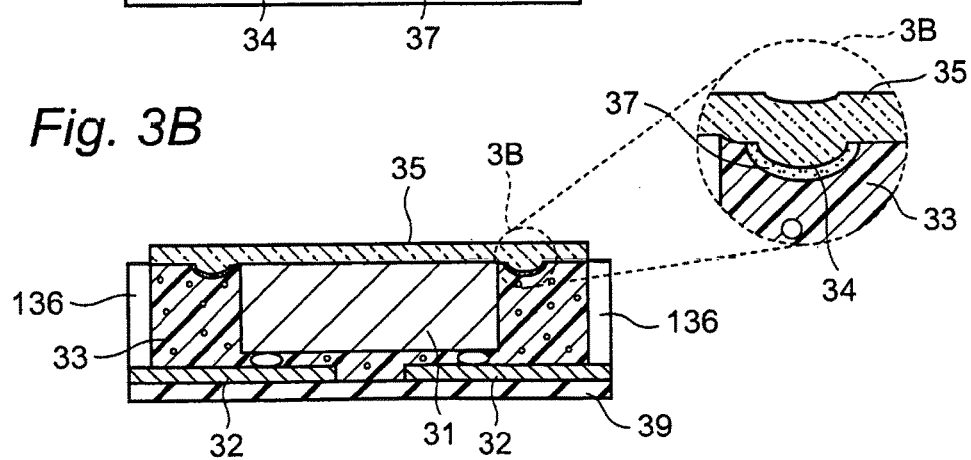

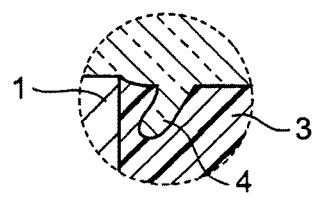
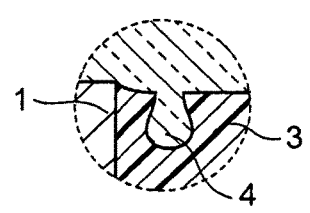
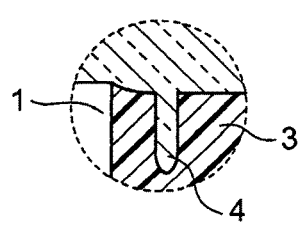
Fig. 6A  Fig. 6B  Fig. 6C
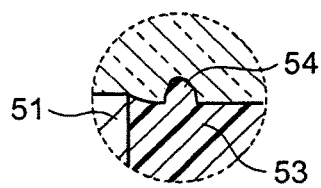
Fig. 6D
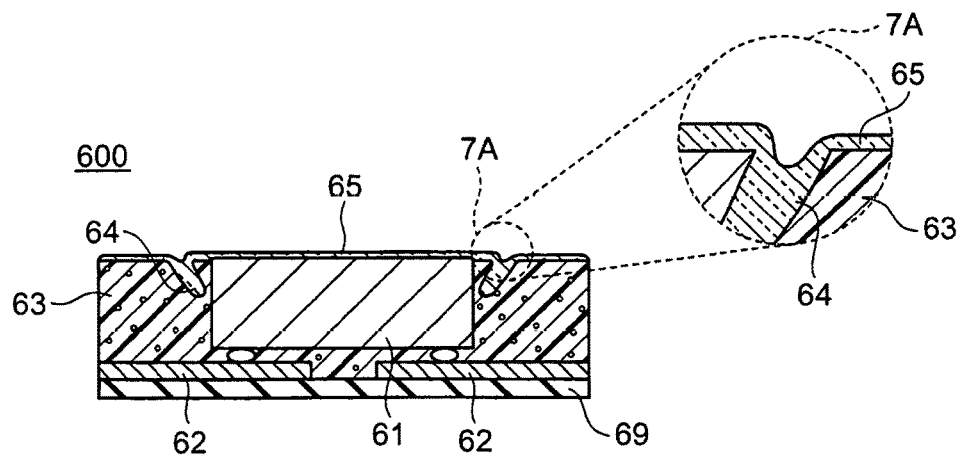
Fig. 7

LIGHT EMITTING DEVICE AND METHOD OF MANUFACTURING THE SAME

CROSS-REFERENCE TO RELATED APPLICATIONS

The present application is a continuation of U.S. patent application Ser. No. 15/017,997, filed on Feb. 8, 2016, which is a divisional of U.S. patent application Ser. No. 14/316,546, filed on Jun. 26, 2014 (now U.S. Pat. No. 9,287,472), which claims priority based on Japanese Patent Application No. 2013-135229, filed on Jun. 27, 2013, and Japanese Patent Application No. 2013-184078, filed on Sep. 5, 2013, the disclosures of which are hereby incorporated by reference in their entireties.

BACKGROUND OF THE INVENTION (1) Field of the Invention

The disclosure relates to a light emitting device including a covering member for covering a side surface of a light emitting element and a light-transmissive member disposed on the light emitting element and an upper surface of the light-transmissive member, and a method of manufacturing the light emitting device.

(2) Description of Related Art

A light-emitting diode (LED) has many features, for example, low power consumption, a long life, high reliability and the like, and is widely utilized for various uses, for example, various lighting devices, a light source for backlight and the like through practical application of a white LED obtained by combination of a blue LED and a phosphor. In recent years, it is expected to further enhance a light emitting output and luminous efficiency of the LED with expansion in demand, and a light source having high power and reliability is required.

The light emitting device obtained by the manufacturing method described in JP 2012-253223 A includes an LED die having a connecting electrode on a bottom face. In the LED die, a reflection layer is extended downward at a side surface and a phosphor layer covers an upper surface of the LED die and an upper part of the reflection layer. According to the structure, the extended part of the reflection layer shields light leaking out of a side part and a bottom part of the LED die after being mounted. Therefore, it is possible to realize high light extraction efficiency. Thus, it is possible to manufacture an LED die having high mass productivity and luminosity.

In the light emitting device described in JP 2010-238846 A, a light emitting element and a side surface of a wavelength converting member disposed on the light emitting element are covered with a covering member containing a light reflective material. Furthermore, a light transmitting member is disposed opposite to a light source portion and is stored in the covering member. Consequently, it is possible to maintain extraction efficiency of light emitted from the light emitting element and to obtain a light emission characteristic which prevents color irregularity or luminance unevenness while reducing a size of the light emitting device.

The light emitting device described in JP 2010-283281 A has the structure of the light emitting device disclosed in the JP 2010-238846 A and has an object to enhance light extraction efficiency while avoiding reduction in reliability due to deterioration of the component. In the light emitting device, the gap and the first reflection surface are provided in the separation region of the light emitting element and the light transmitting member. Consequently, deterioration in an adhesive formed of a resin and the light transmitting member is prevented, and furthermore return light is reflected again to control reduction in optical coupling efficiency to the light transmitting member.

SUMMARY OF THE INVENTION

According to one aspect of the present invention, a light emitting device includes: a light emitting element; a covering member for covering a side surface of the light emitting element; and a light-transmissive member disposed on upper surfaces in a light emitting direction of the light emitting element and the covering member, the light-transmissive member having an end face on substantially the same plane as an end face of the covering member, and in the light emitting device, the covering member has a recess portion or a convex portion on an upper surface thereof, a light emitting surface of the light emitting element and the upper surface other than the recess portion or the convex portion of the covering member are arranged on substantially the same plane, and the light-transmissive member is provided in contact with the recess portion or the convex portion.

According to another aspect of the present invention, a method of manufacturing a light emitting device including a light emitting element, a covering member for covering a side surface of the light emitting element, and a light-transmissive member disposed on upper surfaces in a light emitting direction of the light emitting element and the covering member, the method includes: a first step of forming the upper surface of the covering member so as to be arranged on substantially the same plane as a light emitting surface of the light emitting element, and forming a recess portion or a convex portion on the upper surface of the covering member; a second step of forming the light-transmissive member in contact with the recess portion or the convex portion; and a third step of cutting end faces of the covering member and the light-transmissive member so as to be arranged on substantially the same plane.

In the light emitting device according to one aspect of the present invention, it is possible to enhance adhesion of the covering member and the light-transmissive member, and to maintain reliability and to increase a life.

BRIEF DESCRIPTION OF THE DRAWINGS

FIG. 2A is a plan view showing a light emitting device according to a second embodiment of the present invention, FIG. 2B is a sectional view showing an A-A section in FIG. 2A, FIG. 2C is a view showing an example in which the light emitting element and the recess portion is different from that of FIG. 2A, and FIGS. 2A and 2C illustrate a state brought before a light-transmissive member is formed;

FIG. 3A is a plan view showing a light emitting device according to a third embodiment of the present invention, FIG. 3B is a sectional view showing an A-A section in FIG. 3A and a partial enlarged view of an area 3B including a recess portion, and FIG. 3A illustrates a state brought before a light-transmissive member is formed;

FIGS. 6A to 6C are partial enlarged views in a sectional view showing a recess portion according to the embodiment of the present invention, illustrating an example of the recess portion, and FIG. 6D is a partial enlarged view in a sectional view showing a convex portion according to the embodiment of the present invention, illustrating an example of the convex portion;

FIG. 7 is a sectional view showing the light emitting device and a partial enlarged view of an area 7A including an recess portion according to the second embodiment of the present invention;

DETAILED DESCRIPTION OF PREFERRED EMBODIMENTS

By the light emitting device described in the JP 2012-253223 A and JP 2010-238846 A, it is possible to realize increase in the light extraction efficiency through the light reflecting member. By the light emitting device described in the JP 2010-283281 A, it is possible to relieve deterioration in the adhesive and the light transmitting member. In an LED which is desired to be further enhanced in the light extraction efficiency in future, however, it is hard to perfectly avoid the deterioration in the component and reduction in reliability is concerned.

In consideration of the problems, the disclosure can provide a light emitting device which enhances adhesion of a covering member for covering a side surface of the light emitting element and a light-transmissive member on upper surfaces of the light emitting element and the covering member and has high reliability and a long life.

Embodiments of the present invention will be described below with reference to the drawings. A light emitting device which will be described below serves to implement the technical concept of the some aspects of the present invention and does not restrict the present invention to the following. In particular, dimensions, materials, shapes and relative disposition and the like of components which will be described below do not restrict the technical scope of the present invention, and is simply explained as an example unless otherwise noted. Sizes, positional relationships and the like of members shown in respective drawings may be exaggerated for clear explanation in some cases. Furthermore, each element constituting the present invention may have a mode in which elements are configured by an identical member and the member is used as them, or reversely, a function of one of the members can also be implemented by sharing with the members. Moreover, the embodiments which will be described below can also be applied in proper combination of respective structures or the like unless otherwise noted.

<First Embodiment>

Figure 1A:
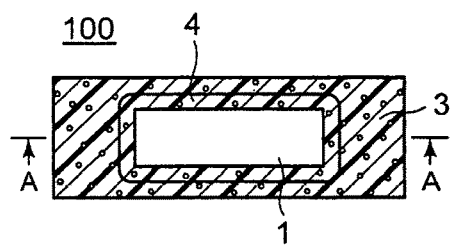
FIG. 1A is a plan view showing a light emitting device according to a first embodiment of the present invention.
Figure 1B:
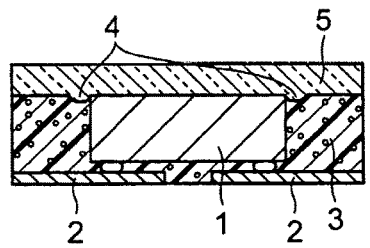
FIG. 1B is a sectional view showing an A-A section in FIG. 1A.

FIG. 1A is a plan view showing a light emitting device according to a first embodiment of the present invention and FIG. 1B is a sectional view showing an A-A section in FIG. 1A. A light emitting device 100 shown in FIG. 1 includes a light emitting element 1, a conductive wiring 2, a covering member 3 and a light-transmissive member 5. The light emitting element 1 is flip chip mounted on the conductive wiring 2. Moreover, the covering member 3 is disposed on the conductive wiring 2. The covering member 3 covers side surfaces of the light emitting element 1 while a light emitting surface of the light emitting element 1 is exposed, and has a recess portion 4 on an upper surface thereof provided in contact with the light-transmissive member 5. The light-transmissive member 5 continuously covers an upper surface in a light emitting direction of the light emitting element 1 and the covering member 3 having the recess portion 4. The covering member of the present embodiment can contain a light reflective material as shown in FIGS. 1A and 1B, and the light-transmissive member can include a wavelength converting member. Although the upper surface of the covering member 3 other than the recess portion 4 and the light emitting surface of the light emitting element 1 are arranged on substantially the same plane, they do not need to be perfectly placed on the same plane.

With the structure described above, light leaking out of a side surface of the light emitting element is reflected toward the light emitting surface by the light reflective material of the covering member 3 and wavelength conversion is carried out by a wavelength converting member of the light-transmissive member so that desired light can be emitted. Moreover, the covering member 3 and the light-transmissive member 5 having end faces aligned with each other can easily be formed by disposing the light-transmissive member 5 taking a shape of a sheet or the like on the upper surfaces of the light emitting element 1 and the covering member 3 to cut the covering member and the light-transmissive member together.

The recess portion 4 is provided on the upper surface of the covering member 3 provided in contact with the light-transmissive member 5, and the light-transmissive member 5 is fitted in the recess portion 4 (that is, the light-transmissive member 5 is provided in contact with a surface of the recess portion 4). Since the light-transmissive member 5 is fitted in the recess portion 4, adhesion of the covering member 3 and the light-transmissive member 5 is enhanced.

In this specification, "an element A is fitted in an element B" means that the element A and the element B are provided in contact with each other. Accordingly, the term "fit" herein may be replaced with "contact" if necessary. For example, "the light-transmissive member 5 is fitted in the recess portion 4" indicates a state in which the surface of the light-transmissive member 5 is provided in contact with the surface of the recess portion 4 in the recess portion 4. This also includes the case in which the element A and the element B are provided in contact with each other through an interposing layer constituted by another solid body or liquid such as a resin layer, for example, an adhesive layer which will be described in a third embodiment.

The recess portion 4 of the covering member is not a recess portion having a gentle curve, arc or the like over the whole surface, which is formed by surface tension through potting of a resin or the like but is a recess portion (for example, having a depth of approximately 30 to 50 μm or more), for example, a hole or a groove formed on the upper surface of the covering member which is disposed on substantially the same plane as the light emitting surface of the light emitting element 1 and the light-transmissive member 5 deeply enters the recess portion 4. Therefore, the adhesion can further be enhanced. The light-transmissive member 5 is fitted in the recess portion 4 (that is, the light-transmissive member 5 is provided in contact with the surface of the recess portion 4). With fine observation, however, the fitting (contact) does not need to be performed in some portions, or a perfect non-contact part (a clearly separated part) may be provided. Most preferably, the recess portion 4 and the light-transmissive member 5 are maintained in close contact without clearance. There may be formed small concavo-convex parts or a rough surface of the member or a partial non-fitting region (non-contact region) in the case in which the light-transmissive member enters the recess portion with difficulty. It is sufficient that the fitting is carried out to hold their adhesion. The case in which the light-transmissive member enters the recess portion with difficulty includes the case in which the recess portion is deep as shown in FIG. 6C (for example, a depth of approximately 50 μm or more), the case in which an open surface and a bottom face in the recess portion are shifted from each other as shown in FIG. 6C, (the open surface of the recess portion is separated from the light emitting element and the bottom part is provided in a direction of the light emitting element), the case in which the recess portion is enlarged toward the bottom as shown in FIG. 6B, and the like.

As described above, a light emitting device according to an aspect of the present invention includes a light emitting element, a covering member for covering a side surface of the light emitting element with at least a part in a substantially equal height to a light emitting surface of the light emitting element, and a light-transmissive member having an end face on substantially the same plane as an end face of the covering member over upper surface in a light emitting direction of the light emitting element and the covering member, and the covering member has a recess portion on its upper surface and the light-transmissive member is fitted in the recess portion. Similarly, the covering member has a convex portion on its upper surface and the convex portion is fitted in (in contact with) the light-transmissive member. the members would be deteriorated by heat or light from the light emitting element while in use, and furthermore in some embodiments of the present invention the light emitting surface of the light emitting element and the upper surface of the covering member other than the recess portion or the convex portion are arranged on substantially the same plane. And the end faces of the covering member and the light-transmissive member are arranged on substantially the same plane. Consequently, the deterioration and the arrangement are likely to cause that the light-transmissive member is peeled off more easily during use. However in the aspects of the present invention, by fitting the light-transmissive member in the recess portion or the convex portion of the upper surface of the covering member (in contact), it is possible to obtain a thin light emitting device having high reliability in which adhesion is enhanced without an adhesive or the like between both of the members.

Each component of the light emitting device according to the embodiments of the present invention will be described below in detail.
(Light Emitting Element)

For the light emitting element 1, a well-known element, more specifically, a semiconductor light emitting element can be utilized. By using a GaN based compound semiconductor in a light emitting element structure, particularly, the light emitting element 1 can emit visible light or UV light having a short wavelength which can efficiently excite a phosphor. A specific light emission peak wavelength is approximately 240 nm to 560 nm, and preferably, approximately 380 nm to 470 nm. In addition, ZnSe based, InGaAs based or AlInGaP based semiconductor light emitting element may be used.

(Light Emitting Element Structure)

A light emitting element structure using a semiconductor layer is preferably configured from at least a first conductivity type (n type) layer and a second conductivity type (p type) layer and has an active layer therebetween in this embodiment. Moreover, the same plane side electrode structure having both of the first and second conductivity type electrodes on one of main surface sides is preferable for the electrode structure. However, it is also possible to use a counter electrode structure in which an electrode is provided on each main surface of a semiconductor layer so as to be opposite to another electrode. With the same plane side electrode structure, it is preferable to use flip-chip mounting in which an electrode formation surface is set to be a mounting surface and a substrate side opposite to the mounting surface is set to be a main light emitting surface. When the flip-chip mounting is used, neither electrode nor wire is provided on a surface side of the light emitting element which is opposed to the light-transmissive member. Therefore, high light extraction efficiency can be obtained. Since electrodes and a substrate in the light emitting element are disposed opposite to each other and connected by bumps or the like, a high radiation property can be ensured and a mounting area can also be reduced. A growth substrate of a semiconductor layer may be removed. In addition, it is also possible to be bonded with a conductive substrate or another light-transmissive member or substrate to the semiconductor layer from which the grown substrate is removed. The removal of the growth substrate can be executed by mounting or holding on a support, a device or a sub-mount and performing peeling, polishing or LLO (Laser Lift Off). Moreover, the light emitting element can have a light reflection structure. More specifically, one of two main surfaces opposed to each other in the semiconductor layer which is opposed to the light emitting surface is set to be a light reflection side, and a light reflection structure can be provided inside the semiconductor layer, the electrode or the like at the light reflection side. Examples of the light reflection structure can include a structure in which a multilayer film reflection layer provided in the semiconductor layer, a structure in which electrodes or a reflection layer including a metal film or dielectric multilayer film having high light reflectivity such as Ag or Al is provided.

An example of the light emitting element 1 in FIGS. 1A to 1D will be described. In the light emitting element 1, an n-type semiconductor layer to be a first nitride semiconductor layer, a light emitting layer to be an active layer, and a p-type semiconductor layer to be a second nitride semiconductor layer are provided on a light-transmissive sapphire substrate in this order. An n-type pad electrode to be a first electrode is provided in a portion in which a part of an n-type layer is exposed, a p-type pad electrode to be a second electrode is provided on a conductive layer or a light-transmissive conductive layer of a high light reflectance such as Ag, which are provided over the most of whole surface of a p-type layer, and a protective film is provided to cover a semiconductor layer with surfaces of n- and p-type pad electrodes exposed in this embodiment. For the substrate of the light emitting element, it is possible to use an insulating substrate such as sapphire and a conductive substrate of a semiconductor such as silicon carbide, Si, ZnS, ZnO, GaN or AlN. In the case in which the substrate of the light emitting element serves as a light emitting surface, it is preferably formed of light-transmissive sapphire, SiN or the like.

(Light-transmissive Member)

The light emitting device 100 in FIGS. 1A to 1D includes the light-transmissive member 5 on the upper surfaces of the light emitting element 1 and the covering member 3 for covering the side surface of the light emitting element 1. The light-transmissive member 5 serves to transmit at least a part of light from the light emitting element 1. The light-transmissive member 5 is disposed on the upper surfaces of the light emitting element 1 and the recess portion 4 of the covering member and is fitted in the recess portion 4. As long as the end face of the light-transmissive member is arranged on substantially the same plane as the end face of the covering member, a shape of the light-transmissive member 5 is not particularly restricted. Accordingly, the lower surface of the light-transmissive member 5 takes such a convex shape so as to be fitted in the recess portion 4 (in other words, to obtain a predetermined contact area) in a region provided in contact with the recess portion 4 of the covering member. When the covering member 3 has a convex portion, the lower surface of the light-transmissive member 5 takes a recess portion in which the convex portion is to be fitted (in contact). Preferably, the recess portion 4 of the covering member and the convex portion of the light-transmissive member 5 perfectly correspond to each other in their shape. However, a non-corresponding portion may be complemented and fitted with an adhesive or the like (a larger contact area may be obtained) or a partial non-fitting (non-contact) portion may be provided. In the case in which the upper surface of the light-transmissive member 5 (the surface which is not provided in contact with the light emitting element and the covering member) may take a gentle recess or convex shape corresponding to a region in which the recess or convex portion of the covering member 3 is positioned (in other words, in the case in which the light-transmissive member 5 is laminated in a soft condition, it may be deformed along the recess or convex portion of the covering member 3 below the light-transmissive member 5).

The number of the light emitting elements 1 to be bonded to the light-transmissive member 5 is not particularly restricted and may be one or more. Two or more of the light emitting elements 1 are preferably provided because a luminous flux quantity can be increased. In the case in which two or more the light emitting elements are provided, preferable light distribution can be easily obtained when the light emitting elements are disposed regularly or cyclically, for example, in a line or in a grid shape at an equal interval.

Examples of the material for the light-transmissive member include a resin, glass, an inorganic substance or the like. Specific examples include a glass plate, a single crystal substance, a polycrystalline substance, an amorphous substance, a ceramic substance and the like. Other examples include a sintered body, an aggregate, a porous body, a substance obtained by mixing a light-transmissive member such as a light-transmissive resin therein or impregnating a light-transmissive member therewith, a molded body of the light-transmissive resin, or the like.

For the light-transmissive member 5, an inorganic material such as glass is preferable to an organic material such as a resin from a viewpoint of a heat resistance. In some embodiments of the present invention, however, it is necessary to fit the light-transmissive member 5 in the covering member 3. For this reason, it is preferable to use the resin capable of easily making a desirable shape. For example, when the light-transmissive member 5 taking a shape of a sheet and formed of a silicone resin is disposed on the upper surface of the covering member 3 having the recess portion or convex portion, in a soft semi-curing condition (for example, a modulus of elasticity of approximately 1 MPa or less), the light-transmissive member is deformed along the shape of the recess portion or the convex portion. Therefore, it is possible to easily carry out fitting of the light-transmissive member 5 and the recess portion or the convex portion. Then, the resin sheet is regularly cured so that it becomes harder as compared with that in the soft condition in disposition, after the completion of the light emitting device. Thus, both mass productivity and reliability are achieved. The light-transmissive member 5 is not restricted to a sheet-shape and preferably used in any shape as long as it has flexibility. For example, the light-transmissive member 5 may be obtained by being formed in a film shape and subjected to laminate processing.

Furthermore, the light-transmissive member 5 may be formed by spraying. Consequently, it is possible to form a light-transmissive member which can easily be fitted in a recess portion in which the light-transmissive member cannot be fitted by disposition of a molded resin in a soft condition, that is, a deep recess portion shown in FIG. 6C or a recess portion having a sidewall taking a complicated shape or a recess portion having an open surface and a bottom part shifted from each other (they are in an oblique state seen in a sectional view) as shown in FIG. 6A. In the case in which the covering member has a convex portion, similarly, it is possible to easily carry out fitting even though the convex portion is high or takes a complicated shape (is oblique as seen in the sectional view). A spray is suitable because a thickness can be finely adjusted by repetition of spraying plural times until a desirable film thickness is obtained. In the case in which the light-transmissive member includes a wavelength converting member such as a phosphor as in the present embodiment, particularly, it is possible to easily obtain a desirable luminescence color by repetitive spraying.

By using a hard light-transmissive member (for example, a modulus of elasticity of 10 MPa or more), it is possible to reduce aging degradation and the light emitting device 100 having a longer life can be obtained. For example, a desirable sintered body is processed to fit (contact) with respect to the recess portion or the convex portion and can be thus disposed opposite to the upper surfaces of the light emitting element 1 and the covering member 3. In the case in which a previously processed light-transmissive member is disposed in contact with the whole surface of the recess portion or the convex portion, it is necessary to form the light-transmissive member with high processing precision. In the case in which the fitting (direct contact with the whole surface of the recess portion or the convex portion) cannot be completely performed by using the previously processed light-transmissive member, it is also possible to make contact with the whole surface of the recess portion or the convex portion by providing an adhesive between the light-transmissive member 5 and the covering member 3.

The light-transmissive member 5 may be constituted by only the materials described above. If the material contains a phosphor capable of carrying out wavelength conversion by absorbing at least a part of the light emitted from the light emitting element 1 as in the present embodiment, however, it is possible to obtain a desirable luminescence color, which is preferable. In this case, the light-transmissive member 5 is a base material containing a phosphor. Moreover, the light-transmissive member 5 may be constituted by only the phosphor. For a typical phosphor capable of performing white light emission in suitably combination with a blue light emitting element, it is preferable to use a YAG based phosphor activated with cerium having a garnet structure (yttrium-aluminum-garnet), an LAG based phosphor (lutetium-aluminum-garget) or the like. In addition, it is possible to use a phosphor such as BAM, BAM:Mn, (Zn, Cd) Zn:Cu, CCA, SCA, nitride phosphor for emitting red light (SCESN, SESN, CESN, CASBN and $CaAlSiN_3$:EU). By increasing a red component using a nitride based phosphor having yellow to red light emission or the like, it is possible to implement a lighting device, a light bulb color LED or the like, which have a high average color rendering index Ra. The phosphor can be disposed, for example, between the light emitting element 1 and the covering member 3, or in an adhesive provided between the components in addition to an inside of a phosphor layer.

For the light-transmissive member 5 containing the phosphor, it is possible to use a substance containing a phosphor with the light-transmissive member set as a base material. A phosphor sheet, phosphor glass, a phosphor sintered substance and the like can be taken as an example.

(Covering Member)

Figure 1C:
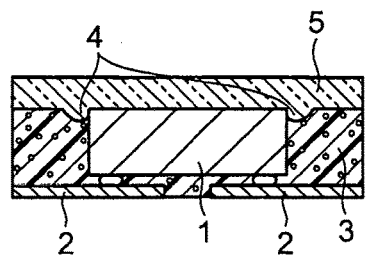
FIG. 1C is a view showing an example in which a recess portion is different from that of FIG. 1B.

The covering member 3 covers the side surface of the light emitting element 1 as shown in FIG. 1B. In detail, the light emitting surface of the light emitting element 1 is exposed and the side surface of the light emitting element 1 is covered so as to be buried. In other words, the light emitting surface of the light emitting element 1 and at least a part of the upper surface other than the recess portion 4 of the covering member are arranged on substantially the same plane and their heights are substantially equal to each other. However, the light emitting surface of the light emitting element 1 and at least a part of the upper surface other than the recess portion 4 of the covering member do not need to have a perfectly equal height and may have a slight difference in the height (for example, approximately 50 µm or less). As shown in FIG. 1C, the covering member 3 does not need to completely cover the side surface of the light emitting element 1.

Moreover, the covering member 3 has a recess portion or a convex portion on the upper surface to be provided in contact with the light-transmissive member 5. When the recess portion or the convex portion is not a gentle curve over the whole surface of the covering member 3, but has a deep hole or groove (for example, a depth of approximately 30 to 70 µm, and more preferably, approximately 50 µm) or a large projection (for example, a height of approximately 30 to 70 µm, and more preferably, approximately 50 µm), adhesion to the light-transmissive member 5 can be enhanced. The fitting property of the light-transmissive member 5 is not deteriorated when a width of the recess portion or the convex portion in a short direction is equal to or smaller than approximately 100 µm, which is preferable.

Figure 1D:
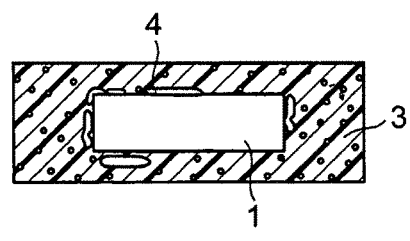
FIG. 1D is a view showing an example in which the recess portion is different from that of FIG. 1A, and FIGS. 1A and 1D illustrate a state brought before a light-transmissive member is formed.

As described above, the recess portion can take a shape of a hole or a groove and the convex portion can take a shape of a projection protruded from the light emitting surface of the light emitting element 1. The recess portion or the convex portion may be provided continuously as shown in FIG. 1A, may be divided as shown in FIG. 1D or may be distributed unevenly. Even if the recess portion or the convex portion is unevenly distributed in a complicated shape, the flexible light-transmissive member can easily be fitted by disposition. If the recess portion or the convex portion surrounds approximately 50% or more of an outer edge of the light emitting element 1, the light-transmissive member 5 is unlikely to be peeled off while in use. When the recess portion or the convex portion is provided along an outer edge of the light emitting element 1 in a longitudinal direction, particularly, the adhesion to the light-transmissive member 5 can be enhanced effectively.

When the covering member is formed by a metal mold, a mold release sheet is disposed between the metal mold and the light emitting element in order to easily demold the metal mold from the light emitting element and the covering member in some cases. It is possible to form the recess portion 4 of the covering member by utilizing slack (or swelling) of the mold release sheet. The slack (or swelling) of the mold release sheet is generated as follows. More specifically, the mold release sheet in a portion pressed by the light emitting element and the metal mold is slackened in a direction of the peripheral of the light emitting element. The slack forms the recess portion on the covering member. If a modulus of elasticity of the slack of the mold release sheet (a modulus of elasticity of a portion having the mold release sheet slacked) is higher than a modulus of elasticity of the covering member in the press of the metal mold (e.g. when filled with the covering member 3 in a state of a molten resin), it is possible to form the recess portion. In this case, the recess portion 4 is often formed along the light emitting element. However, it is also possible to form a recess portion separated from the light emitting element. Furthermore, the depth of the recess portion 4 may be almost a double of a thickness of the mold release sheet in many cases. For example, when the thickness of the mold release sheet is set to be approximately 50 µm, the recess portion 4 having a depth of approximately 20 to 100 tends to be formed.

From the foregoing, the recess portion tends to be deeper when the mold release sheet is thicker. If twists of the mold release sheet are generated by using a thin mold release sheet, it is also possible to form a recess portion having a comparatively narrow and deep open surface by the twists. In this case, furthermore, the recess portion is often formed in a separated position from the light emitting element and takes such a shape that a bottom part is shifted in the direction of the light emitting element with respect to the open surface of the recess portion. Referring to the recess portion, the light-transmissive member in the recess portion is held at its upper and lower parts by the covering member. Therefore, the light-transmissive member is more unlikely to be peeled off, which is suitable.

When one or more light emitting elements are arranged and an arrangement interval thereof is reduced (for example, they are separated from each other by approximately 100 to 1000 μm), moreover, the slack of the mold release sheet pressed by the adjacent light emitting elements can be made synergistic so that a deeper recess portion (for example, a depth of approximately 50 μm or more) can be formed and the recess portion is easily formed along the light emitting element.

Figure 5:
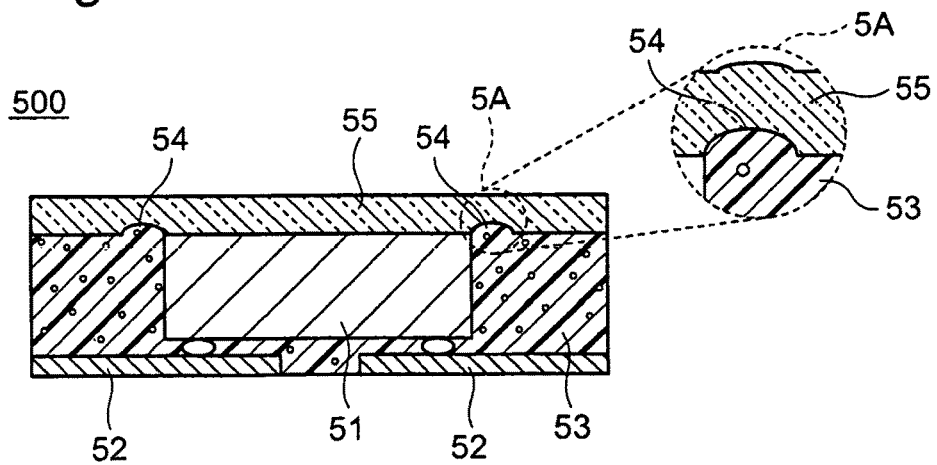
FIG. 5 is a sectional view showing a light emitting device and a partial enlarge view of an area 5A including a convex portion according to a fourth embodiment of the present invention, illustrating an example in which a covering member has the convex portion.

A component in a region having a large light emission quantity, that is, the light-transmissive member 5 in a portion provided in direct contact with the light emitting element 1 tends to be deteriorated most rapidly and to be peeled off most readily. When the recess portion 4 or a convex portion 54 is formed along the light emitting element as shown in FIG. 1B or FIG. 5 and is thus fitted in (in contact with) the light-transmissive member, the adhesion of the covering member 3 and the light-transmissive member 5 can be enhanced effectively. By means of a metal mold and a mold release sheet to form the covering member, it is possible to form a desirable recess portion along the light emitting element by adjusting a pressing pressure of the metal mold, a thickness of the mold release sheet, arrangement of the light emitting element or the like. Therefore, this is efficient. It is also possible to form the recess portion 4 shown in FIG. 1C. Referring to the recess portion 4, it is possible to form by the slack of the mold release sheet pushed against the light emitting element. Consequently, it is possible to obtain the recess portion is formed by the side surface of the light emitting element 1 and the covering member 3. When the side surface of the light emitting element 1 is partially exposed and the light-transmissive member 5 takes such a recess shape as to hold the light emitting element 1, there can be obtained a structure in which the light-transmissive member 5 is peeled off with more difficulty.

In the present embodiment, one of the light emitting elements 1 taking a rectangular shape in planar view can be used and the recess portion 4 can be provided in a shape of a circumferential groove along peripheral edges of all of four sides in the light emitting element 1. The recess portion provided along the light emitting element indicates a state in which the recess portion 4 is provided in contact with the light emitting element as seen on a plane shown in FIG. 1A. Since the recess portion is provided along a whole peripheral edge of the light emitting element, the adhesion condition of the covering member 3 and the light-transmissive member 5 is made uniform so that both of the members are more unlikely to be peeled off. Moreover, this state is preferable because light emitted from the light emitting element 1 to the light-transmissive member 5 is transmitted uniformly. In the case in which the light-transmissive member includes a phosphor, particularly, wavelength conversion can be uniformly carried out so that color irregularity can be prevented. In the case in which the convex portion is formed on the whole peripheral edge of the light emitting element, the convex portion takes a shape of a frame surrounding the light emitting element. As long as the recess portion 4 or the convex portion fits to (contacts with) the light-transmissive member 5 over the upper surface of the covering member 3, the recess portion 4 or the convex portion may be separated from the light emitting element 1 or the recess portion 4 or the convex portion does not need to be formed over the whole peripheral edge, and a formation position is not particularly restricted. The case in which a plurality of light emitting elements is arranged is also the same.

For the material of the covering member 3, it is possible to use a substance containing a light reflective material in a light-transmissive base material. If the covering member 3 is the light reflective member, the light emitted from the light emitting element 1 can be reflected toward the light-transmissive member located in upper direction without leakage of the light emitted from the light emitting element 1 out of the side surface, which is preferable. Moreover, the covering member may be configured from only a light-transmissive base material having no light reflectivity or may include the wavelength converting member of the phosphor. If a forming step is separated, the material may be exactly equivalent. By including the wavelength converting member in one of the light-transmissive member and the covering member and setting the other to be light-transmissive without the wavelength converting member included, it is possible to reduce absorption of light in wavelength conversion. Thus, it is possible to obtain a light emitting device having high light extraction efficiency. For the wavelength converting member to be contained in the base material, a phosphor is particularly preferable. The phosphor above mentioned as the wavelength converting member to be contained in the light-transmissive member is preferably used.

The base material of the covering member can be, for example, a resin material. In addition, a light-transmissive silicone resin composition, a denatured silicone resin composition and the like can be used. Moreover, it is also possible to use an insulating resin composition with translucency, for example, an epoxy resin composition, a denatured epoxy resin composition, an acrylic resin composition or the like. It is also possible to use a sealing member having an excellent weather resistance such as a hybrid resin containing at least one of the resins. If the above resins are used as a base material, a recess portion or a convex portion can easily be formed on the upper surface of the covering member and controllability, sealing performance, and airtight performance of a covered region (the side surface of the light emitting element) can be enhanced, which is preferable. It is also possible to use an inorganic substance having an excellent light resistance, for example, glass, silica gel or the like. By using a base material having a high heat resistance, furthermore, it is possible to deal with heat transferred from the light emitting element or the light-transmissive member. In the first embodiment, a silicone resin can be used for a resin serving as a base material constituting the covering member 3. The silicone resin has a high heat resistance and light resistance and is preferably used.

A light reflective material has high light reflectivity. For the material, it is also possible to use one oxide selected from the group consisting of Ti, Zr, Nb, Al and Si or at least one of AlN and MgF, and specifically, at least one selected from the group consisting of $TiO_2$, $ZrO_2$, $Nb_2O_5$, $Al_2O_3$, MgF, AlN and $SiO_2$. A particle of the light reflective material is preferably one oxide selected from the group consisting of Ti, Zr, Nb and Al because high light reflectivity is obtained and light absorption can be controlled, and a refractive index difference from the base material can be increased. The covering member 3 can also be constituted by a molded body obtained by the light reflective material, and specifically, can also be obtained by a porous material such as an aggregate obtained by condensing the particle or a sintered body. In addition, it is also possible to use a molded body obtained by a sol-gel method. Consequently, the refractive index difference between the light reflective material and air in the porous material can be increased. Therefore, the light reflectivity can be enhanced. Furthermore, the covering member 3 can be constituted by an inorganic material.

Therefore, reliability can be enhanced so that a composite molded body can also be obtained.

In the covering member 3 containing the light reflective material in the base material, the amount of leaking light differs depending on a concentration of the light reflective material. Therefore, it is preferable to properly adjust the concentration of the light reflective material depending on the shape or size of the light emitting device. For instance, in the case in which the width or thickness of the covering member is reduced in a comparatively small light emitting device (for example, the thickness of the light emitting device is approximately 50 μm or less), it is preferable to include a light reflective material having high concentration. The particle diameter of the light reflective material may be the same as that of a conventional filler or the like in order to be suitable for manufacture such as preparation, application or molding for the raw material of the covering member 3. As an example, preferably, the concentration of the light reflective material can be 20% by weight or more and the thickness of the covering member can be approximately 20 μm or more. Within these ranges, productivity can be enhanced and emitted light having high luminance and directivity can be obtained from the light emitting surface. Furthermore, another filler may be added into a base material which is a resin. For example, a heat conductive material can be added, heat generated by the light emitting element can be diffused efficiently, and thus reliability and an output property can be enhanced. As the heat conductive material, specifically, a thermal conductivity of 0.8 W/K·m or more is preferable. A metallic material such as Ag or Cu or a ceramics material such as diamond, alumina or AlN can be taken as an example, these may be mixed and contained. Moreover, a pigment or the like can also be mixed in the covering member for coloring to absorb light having a specific wavelength.

Although the covering region of the covering member 3 is described above, the covering member 3 is preferably provided between the light emitting element and a pair of conductive wirings. In detail, the covering member 3 can be provided to fill a part between the p pad electrode and the n pad electrode on the bottom face of the light emitting element 1 which is flip-chip mounted, and a conductive adhesive material. Consequently, the pair of conductive wirings can be insulated, and light extraction efficiency and wavelength conversion efficiency can be enhanced as well as heat radiation can be improved.

(Mounting Substrate)

A mounting substrate is a substrate where the light emitting element is mounted and is electrically connected. A substrate having a conductive wiring on a support substrate and a substrate formed by only the conductive wiring can be taken as an example. Furthermore, the mounting substrate formed by only the conductive wiring can be classified into a substrate which originally has a support substrate, is peeled off in a manufacturing process and is finally formed by the conductive wiring, and a substrate formed by only the conductive wiring from the beginning (for example, a lead electrode or the like). For any of them, it is also possible to use a conductive adhesive such as solder, Ag paste or Au bump in mounting on the light emitting element.

First, the mounting substrate having the conductive wiring on the support substrate will be described in detail. The conductive wiring on the support substrate can be formed by a metal layer such as Au, Cu or Al, and different metals may be laminated as two layers or more. Although a thickness of the conductive wiring is not particularly restricted, the thickness is preferably approximately 1 to 50 μm. The support substrate is preferably formed by a material having low transmittance. Specifically, ceramics ($Al_2O_3$, AlN or the like) or a resin such as a phenol resin, an epoxy resin, a polyimide resin, a BT resin or polyphthalamide (PPA) can be taken as an example. Moreover, a metal substrate having an insulating layer formed on a surface may be used. The mounting substrate having the conductive wiring on the support substrate described above is preferable because light emitted from the light emitting element passes downward from the substrate with difficulty so that the light extraction efficiency of the light emitting device can be enhanced. In the case in which the conductive wiring is a thin film having a thickness of approximately several μm or the case in which the covering member has no light reflectivity, the mounting substrate is preferably used for preventing light leakage.

Next, the mounting substrate formed by only the conductive wiring will be described. In the case in which the support substrate is removed in the manufacturing process, the conductive wiring can be formed of a metal such as Cu, Al, Au, Ag, W, Mo, Fe, Ni or Co or their alloy (a Fe—Ni alloy or the like), phosphor bronze, Cu containing Fe, ITO or the like. A film thickness is preferably set to be approximately 25 to 200 μm, and more preferably, approximately 50 to 100 μm, for example. It is particularly preferable that the conductive wiring having such a thickness is a gold-plated layer laminated by gold plating.

For the support substrate to be removed, it is possible to use a metal plate having conductivity such as an SUS plate, and furthermore, an insulating plate such as polyimide where a conductive film is formed by sputtering or vapor deposition. Alternatively, it is also possible to use an insulating plate-shaped member to which a thin metal film or the like can be stuck. Moreover, it is necessary to carry out peeling from the conductive wiring in this embodiment. For this reason, it is necessary to use a bendable member. Depending on a material, it is preferable to use a plate-shaped member having a thickness of approximately 10 to 300 μm. The material of the support substrate includes a metal plate formed of Fe, Cu, Ag, Co or Ni, a resin sheet formed of polyimide to which a thin metal film or the like can be stuck as well as the SUS. Thus, the support substrate is not provided and the conductive wiring forms an outer surface of the light emitting device 100. Consequently, it is possible to obtain a small-sized light emitting device.

Preferably, a difference in a linear expansion coefficient between a conductive wiring and a covering member is controlled to be decreased. The difference can be preferably set to be approximately 40% or less, and more preferably, approximately 20% or less. Consequently, it is possible to suppress peeling of the conductive wiring and the covering member, thereby obtaining a light emitting device having excellent reliability. Moreover, a small difference in the linear expansion coefficient between the covering member and the support substrate to be removed is also preferable. The difference can be preferably set to be approximately 30% or less, and more preferably, approximately 10% or less. In the case in which an SUS plate is used as the support substrate to be finally removed, the difference in the linear expansion can be preferably approximately 20 ppm or less and more preferably approximately 10 ppm or less. Consequently, it is possible to relieve a residual stress generated on the surfaces of the covering member and the SUS plate. Thus, it is possible to relax a warp of an assembly in the light emitting device after peel-off of the SUS plate. By lessening the warp, it is possible to reduce internal damage such as wire cutting. Thus, it is possible to control a positional shift in division into individual pieces, thereby carrying out manufacture with high yield.

As the mounting substrate to be originally formed by only the conductive wiring, a lead electrode can be taken as an example. For a material of the lead electrode, Fe, Cu, Cu containing Fe, Cu containing Tin, Al or the like is preferable from the viewpoint of an electric resistance. By carrying out punching over the metal plate, it is possible to form a lead frame having plural pairs of protruded portions serving as a pair of positive and negative lead electrodes. Preferably, a surface of the lead electrode is covered with a metal containing Ag, Au or Pd by gold plating, sputtering or the like because light reflectance can be enhanced.

(Frame Body)

The light emitting device may have a frame body for holding the covering member. The frame body can be formed by ceramic, a resin or the like. As a material, alumina having high light reflectance or the like is preferably used. If a reflection film is formed on a surface, however, there is no restriction. In addition, the frame body may be formed by screen printing or bonding a separated molded body to the support substrate. Moreover, the frame body may be colored in accordance with purposes. The frame body can also be removed after filling or molding the covering member. If the removal is not performed, the frame body can function as a member having light reflectivity. When the frame body has light reflectivity, the frame body may be regarded as a part of the covering member because it has the same function. When the frame body is also regarded as a part of the covering member, the end face of the light-transmissive member can be formed on substantially the same plane as the end face of the frame body.

(Adhesive)

An adhesive may be properly provided between any of two members selected from the light emitting element, the covering member, the light-transmissive member, the mounting substrate and the frame body in order to intensify fixation of the members. In the first embodiment, an adhesive (an adhesive layer) is not provided in consideration of a cost or productivity.

The adhesive is preferably formed by a material which can effectively guide the light emitted from the light emitting element to the light-transmissive member side and can optically connect both of the members. Examples of a material for the adhesive include a resin material to be used in each of the members. As an example, a light-transmissive adhesive material such as a silicone resin can be used. The similar light-transmissive adhesive may be provided between the other members or on an optical path. An applying method is not particularly restricted, that is, discharge may be carried out by a dispenser or a resin having low viscosity may be subjected to spin coating through a spin coater. An application quantity or an application region can easily be adjusted by the dispenser, and the adhesive can easily be provided in a uniform thickness within a wide area by the spin coating.

(Method of Manufacturing Light Emitting Device)

Figure 4A:
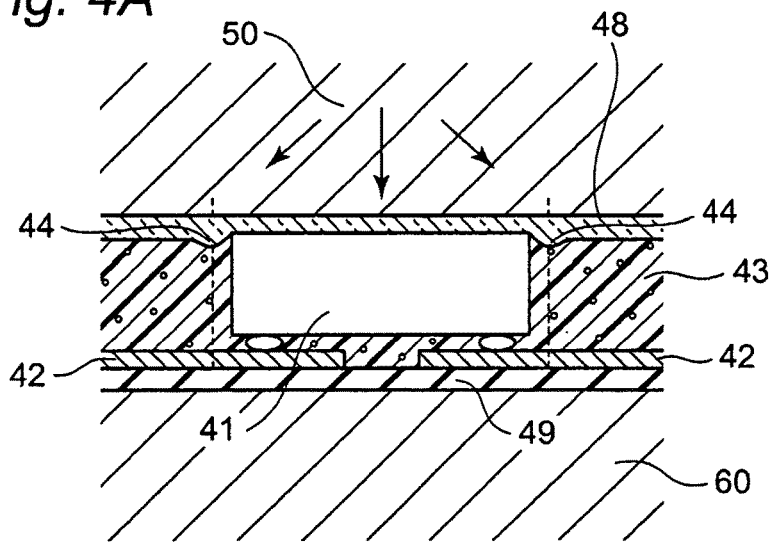
FIG. 4A is a schematic view showing a process for manufacturing the light emitting device according to the first embodiment of the present invention and FIG. 4B is a sectional view showing the light emitting device formed in accordance with the manufacturing process.
Figure 4B:
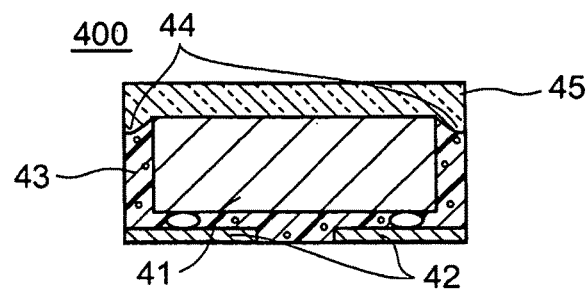

An example of a method of manufacturing the light emitting device 100 shown in FIGS. 1A to 1B will be described below with reference to FIG. 4. As shown in FIG. 4A, a bump is formed on a light emitting element 41 and the light emitting element 41 can be flip-chip mounted on a conductive wiring 42 on a support substrate through the bump. In this example, each light emitting element 41 can be arranged and mounted on a corresponding region to a single light emitting device (the number of the light emitting elements can be changed properly). The support substrate is removed in the manufacturing process.

(First Step)

In a first step, an upper surface of a covering member is formed on substantially the same plane as a light emitting surface of the light emitting element and a recess portion is formed on the upper surface. Specifically, an upper metal mold 50 disposed on the light emitting surface side of the light emitting element 41 and a lower metal mold 60 disposed on a lower surface side of a support substrate 49 can be used to interpose the support substrate 49 and the light emitting element 41 mounted on the support substrate 49, thereby forming a covering member 43 with a resin containing a light reflective material.

When the metal mold is used as described above, a mold release sheet 48 can be disposed in close contact with the upper metal mold. Consequently, an interference of the light emitting element 41 and the upper metal mold can be relieved so that the metal mold and the member can easily be separated from each other. In addition, the mold release sheet 48 in a portion to be pressed against the light emitting element and the upper metal mold by a stress in pressing is slackened in a direction of the covering member 43 on a peripheral edge of the light emitting element. Consequently, a groove-shaped recess portion 44 can be formed along the light emitting element on the upper surface of the covering member 43. In other words, the covering member 43 and the recess portion 44 can be formed at the same time. When a pressure in the pressing is raised, the slack of the mold release sheet is increased so that a deep recess portion can be formed on the covering member. A recess portion or a convex portion is preferably provided around the light emitting element which is easily influenced by light or heat, and most preferably, along the light emitting element. By utilizing the mold release sheet 48, it is possible to reduce a cost of the metal mold. And, it is possible to form the recess portion along the light emitting element without damage of the light emitting element. The recess portion can be formed by using the slack of the mold release sheet, and furthermore, by a convex structure of the upper metal mold, etching, cutting, blast processing or the like. A recess portion separated from the light emitting element can also be formed. The first step is performed before the formation of the light-transmissive member 45.

(Second Step)

In a second step, a light-transmissive member 45, that is, a phosphor sheet containing a phosphor in this embodiment is directly disposed on upper surfaces in a light emitting direction of the light emitting element 41 and the covering member 43, and is fitted in (in contact with) the recess portion 44 of the covering member. By disposing a comparatively soft light-transmissive member having adhesiveness which is obtained by containing a phosphor in a resin, it is possible to carry out wavelength conversion of the light emitted from the light emitting surface into a desirable luminescence color. Since the light-transmissive member can easily be deformed in conformity to the recess portion 44, the fitting can readily be performed. In addition, the light-transmissive member 45 can be formed by an application method, a squeegee, a spray, a metal mold or the like.

(Third Step)

Finally, the support substrate 49 is peeled from a conductive wiring 42, and dicing at predetermined positions is collectively performed to separate light emitting devices each other 1 in such a manner that the end faces of the covering member 43 and the light-transmissive member 45 are arranged on substantially the same plane. Consequently, it is possible to obtain the same device as the light emitting device 100 in FIGS. 1A to 1D. The dicing position may be placed in the middle of a recess portion or a convex portion when a mounting interval between the light emitting elements is small or when a recess portion or a convex portion is separated from the light emitting element as shown in a dotted line of FIG. 4A, for example. In this case, the recess portion 44 is obtained as shown in a light emitting device 400 of FIG. 4B, and the recess portion is cut in the middle. Consequently, it is possible to manufacture a small-sized light emitting device with high mass productivity.

<Second Embodiment>

FIG. 2A is a plan view showing a light emitting device according to a second embodiment of the present invention and FIG. 2B is a sectional view showing an A-A section of FIG. 2A. The light emitting device may have substantially the same structure as that of the first embodiment and may be manufactured by substantially the same manufacturing method except that a mounting substrate is a lead electrode 22, a plurality of (two in the drawing) light emitting elements 21 is disposed and a recess portion is formed to surround the light emitting elements. The plurality of light emitting elements 21 increases a luminous flux quantity, and furthermore slack of a mold release sheet between the adjacent light emitting elements can be made synergistic. Therefore, the recess portion between the light emitting elements can be formed more deeply than a recess portion which is not interposed between the light emitting elements. If the mounting substrate is the lead electrode 22, a step of peeling a support substrate can be eliminated, which is preferable. In the light emitting device in FIG. 2C, four light emitting elements are provided and a plurality of recess portions can be formed along the respective light emitting elements.

<Third Embodiment>

FIG. 3A is a plan view showing a light emitting device according to a third embodiment of the present invention and FIG. 3B is a sectional view showing an A-A section in FIG. 3A and a partial enlarged view of area 3B which includes a recess portion. In the partial enlarged view, an upper surface of a light-transmissive member 35 can be gently dented corresponding to a groove of a recess portion 34 of a covering member 33. In the present embodiment, a covering member 33 has no light reflectivity but is formed by a light-transmissive resin such as a silicone resin, a recess portion 34 is separated from a light emitting element 31 to surround a peripheral edge of the light emitting element 31, and an adhesive 37 is provided between the recess portion 34 and a light-transmissive member 35 (that is, the light-transmissive member 35 is fitted in (in contact with) the recess portion 34 through the adhesive 37). Moreover, a conductive wiring 32 and a frame body 136 can be provided on an upper surface of a support substrate 39 and an upper surface of the covering member is formed in a slightly lower place as compared with a light emitting surface of the light emitting element 31. The other structures are substantially the same as that in the first embodiment and description of the same structures will be omitted appropriately.

In a light emitting device 300, the light emitting element 31 is arranged on the conductive wiring 32 formed on the upper surface of the support substrate 39 to establish connection, and a desirable frame body 136 is provided to surround them. The covering member 33 can be defined by the frame body 36. Therefore, the covering member 33 can be easily formed by a potting process using a dispenser (a quantitative liquid discharge device) or the like. Furthermore, the frame body 136 has light reflectivity. Therefore, it is possible to reflect light emitted from the light emitting element side and transmitted through the covering member and guide the reflected light in a direction of the light-transmissive member provided in an upper part. In the drawings, although a height of the frame body 36 is substantially the same as that of the light emitting surface of the light emitting element 31, it may be greater or smaller.

In the third embodiment, the adhesive layer 37 is provided in the recess portion and bonds the covering member 33 to the light-transmissive member 35. When the adhesive 37 is provided between the covering member 33 and the light-transmissive member 35, it is possible to effectively prevent peel-off of the light-transmissive member 35 without reducing light transmission efficiency. In the case in which the light-transmissive member 35 is hard and has no viscosity like ceramic, a phosphor sintered plate or the like, or the case in which the recess portion 34 is deep and it is difficult to fit the light-transmissive member 35 with the recess portion 34 (it is difficult that the light-transmissive member 35 is in contact with the recess portion 34), the adhesive layer 37 can be preferably used for ensuring a fitting property. An application area of the adhesive layer is not restricted to the recess portion 34 but can also be disposed on the upper surface of the covering member other than the recess portion or the light emitting element. With increase in the application area, the adhesion of the light-transmissive member can be enhanced.

As in the present embodiment, the light-transmissive member 35 does not need to be disposed on an upper surface of the frame body 136 having the light reflectivity. In the case in which the covering member 33 has the light reflectivity, however, the frame body 136 may be regarded as a part of the covering member 33 and the end faces of the light-transmissive member 35 and the frame body 136 may be formed to be arranged on substantially the same plane.

Although the recess portion 34 is not provided along the light emitting element 31, it can be formed by utilizing slack of a mold release sheet. In addition, the recess portion 34 can be formed by using a jig to carry out polishing, etching or blast processing into a desirable recess shape or by utilizing a convex structure of an upper metal mold. Moreover, a plurality of recess portions may be provided in combination of the methods. By the polishing, the etching or the blast processing, it is possible to select a detailed shape, depth and position of the recess portion 34. The structure according to the third embodiment has the support substrate, and the conductive wiring 32 provided on the upper surface of the support substrate 39 can be connected to a conductive wiring at a back face of the support substrate through a conductive wiring provided in a thickness direction of the support substrate. If the support substrate is provided, a step of peeling the support substrate off can be eliminated, and leakage of light toward a lower part of the substrate can be prevented, which is preferable.

The covering member 33 may contain a phosphor. For example, in the case in which the blue light emitting element 31 (a light emission wavelength of 430 nm to 490 nm) is used, the covering member 33 may contain an SCASN based phosphor such as (Sr, Ca) $AlSiN_3$:Eu which is excited by blue light and emits red light and a CASN based phosphor such as $CaAlSiN_3$:Eu and the light-transmissive member 35 may contain a YAG based phosphor for emitting green color. Consequently, RGB (red, green, blue) light can be emitted so that it is also possible to obtain light emitting device 300 for emitting white light having a higher color rendering property.

<Fourth Embodiment>

In a light emitting device 500 shown in FIG. 5, a covering member 53 has a convex portion 54. The light emitting device 500 according to the present embodiment is different from the light emitting device according to the first embodiment having the recess portion in that a light-transmissive member 55 takes such a recess shape which is fitted with the convex portion 54, and structures of the other components and a manufacturing method can be set to be substantially the same as those in the light emitting device according to the first embodiment.

In the same manner as the recess portion, the closer to a light emitting element 51 the convex portion is the more effectively peel-off of the light-transmissive member due to deterioration of the member can prevent. In consideration of adhesion of the light emitting element 51 and the light-transmissive member 55, however, the convex portion is preferably separated from the light emitting element 51 if the light-transmissive member is disposed in a comparatively hard condition. The reason is as follows. When the light-transmissive member in the comparatively hard condition is disposed, it takes a shape which does not partially conform to a light emitting surface due to the convex portion. In that case, the emitted light is uniformly transmitted with difficulty. By disposing the light-transmissive member in a soft condition, however, it is possible to form the light-transmissive member in close contact with the light emitting surface of the light emitting element. In this case, the convex portion is preferably formed along the light emitting element.

The convex portion 54 is generally formed by the recess structure of an upper metal mold, and can also be formed by tear of a thin mold release sheet. The tear is generated when the mold release sheet is used in formation of a covering member and an interval between light emitting elements is narrow. In the case in which the tear of the mold release sheet is utilized, the convex portion 54 can be formed along the light emitting element simultaneously with filling of the covering member in the same manner as the formation of the recess portion. However, a distorted shape shown in FIG. 6D is likely to be obtained (in the shape, a surface of the convex portion 54 is not smooth and concavo-convex portions which can be recognized with naked eyes are provided).

Other methods of forming a convex portion include a method of previously providing a covering member to be higher than a light reflection surface of a light emitting element and masking the light emitting element and a peripheral edge portion of the light emitting element, and performing etching, cutting or blast processing over an unmasked part so as to be arranged on substantially the same plane as the light emitting surface of the light emitting element, and a method of forming a covering member to be arranged on substantially the same plane as the light emitting surface by a metal mold, potting and the like and then forming a convex portion in a desirable position through the potting or the like. Moreover, a plurality of convex portions may be provided in proper combination of the methods described above. In any case, there is a small possibility that the light emitting element is broken in the formation of the convex portion. However, the structure in which the covering member has a recess portion is preferable because the light emitting device can have a thickness reduced.

<Fifth Embodiment>

Figure 8A:
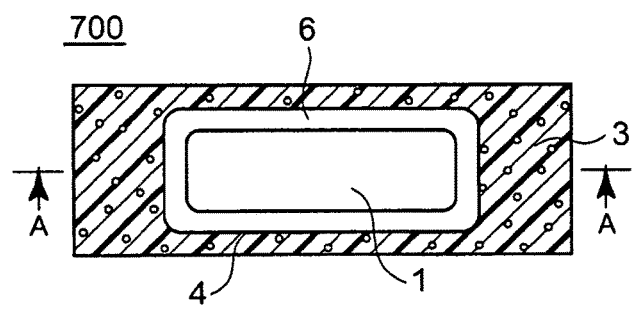
FIG. 8A is a plan view showing a light emitting device according to a fifth embodiment of the present invention, illustrating a state brought before a light-transmissive member is disposed.
Figure 8B:
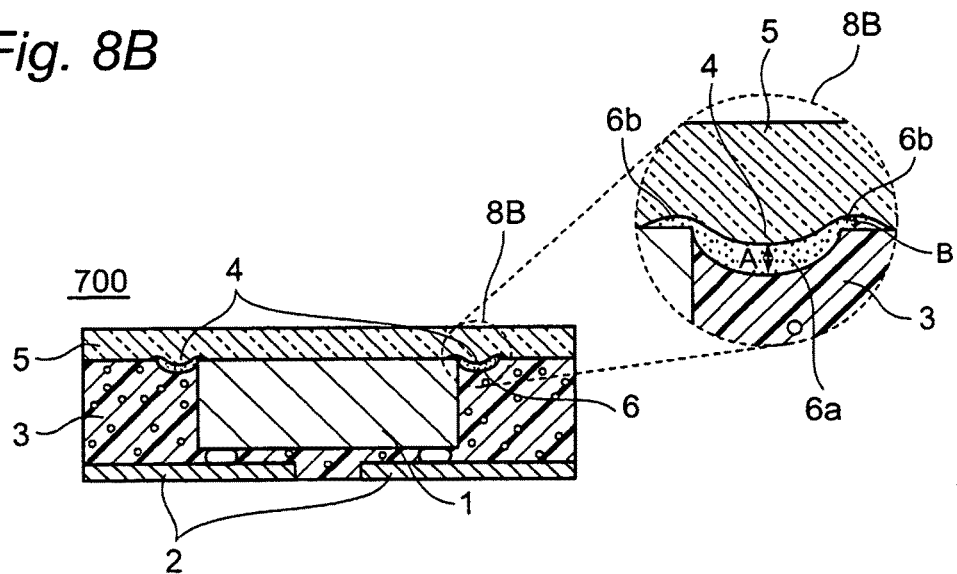
FIG. 8B is a sectional view showing an A-A section in FIG. 8A, and a partial enlarged view of an area 8B including a recess portion and an adhesive layer.

FIG. 8A is a plan view showing a light emitting device 700 according to a fifth embodiment of the present invention. FIG. 8B is a sectional view showing an A-A section in FIG. 8A, and a partial enlarged view of an area 8B including a recess portion and an adhesive layer. The light emitting device 700 according to an example shown in FIGS. 8A and 8B can be mainly configured by a light emitting element 1, a conductive wiring 2, a covering member 3, a light-transmissive member 5 and an adhesive layer 6 for bonding the covering member 3 to the light-transmissive member 5. The light emitting element 1 is flip-chip mounted on the conductive wiring 2. Moreover, there is disposed the covering member 3 which covers a side surface of the light emitting element 1 while a light emitting surface of the light emitting element 1 is exposed, and has a recess portion 4 on an upper surface provided in contact with the light-transmissive member 5. At least parts of the light emitting surface of the light emitting element and an upper surface of the covering member other than the recess portion are arranged on substantially the same plane. Furthermore, the light-transmissive member 5 continuously covers the upper surfaces in a light emitting direction of the light emitting element 1 and the covering member 3, and the end faces of the covering member 3 and the light-transmissive member 5 are formed on substantially the same plane. In the present embodiment, the light-transmissive member 5 can include a phosphor capable of performing wavelength conversion over at least a part of light emitted from the light emitting element, and the covering member 3 can contain a light reflective material.

The adhesive layer 6 is disposed in at least the recess portion 4 (a portion disposed in the recess portion and a portion disposed on an outside of the recess portion will be represented as adhesive layers 6a and 6b in the adhesive layer 6 respectively in some cases). By the adhesive layer 6a of the recess portion, at least parts of the light-transmissive member 5 and the covering member 3 are bonded to each other. In other words, the light-transmissive member 5 is not perfectly fitted in the recess portion 4 and the adhesive layer 6a of the recess portion is supplemented in at least a part of a clearance between both of the members (for example, the whole surface of the recess portion 4 is not provided in direct contact with the light-transmissive member 5 but at least a part of the recess portion 4 is provided in contact with the light-transmissive member 5 through the adhesive layer 6a). In the fifth embodiment, the adhesive layer 6b can be also provided on the upper surface of the light emitting element and the covering member around the recess portion.

According to some embodiments of the present invention, at least the parts of the light-transmissive member and the covering member are bonded to each other through the adhesive layer of the recess portion. Therefore, it is possible to prevent peel-off of the light-transmissive member and the covering member having the end faces aligned without thickening the light emitting device. In the case in which it is difficult to ensure that both of the members are directly bonded, for example, a hard light-transmissive member is disposed in a comparatively deep recess portion, particularly, it is possible to effectively enhance adhesion. Furthermore, it is possible to adjust the thickness of the adhesive layer by the recess portion (a separation distance between the light emitting element and the light-transmissive member). And it is possible to maintain light extraction efficiency or wavelength conversion efficiency of light emitted from the light emitting element.

Next, each component of the light emitting device according to the present embodiment will be described below in detail. In the case in which the structure described above may be used for any of the components, explanation will not be given in order to avoid repetition. Accordingly, a structure which is not especially explained may have the structure described above.

(Covering Member)

The covering member 3 covers the side surface of the light emitting element 1 as shown in FIG. 8B. In detail, the light emitting surface of the light emitting element 1 and at least a part of an upper surface of the covering member other than the recess portion are arranged on substantially the same plane, and their heights are substantially equal to each other. However, the heights do not need to be perfectly equal to each other and has a slight difference in the height (approximately 30 µm or less). As shown in FIG. 9A, the covering member 3 does not need to cover the whole side surface of the light emitting element 1.

Moreover, the covering member 3 has the recess portion 4 on the upper surface thereof in the light emitting direction of the light emitting element. The recess portion 4 is not a gentle curve over the whole surface of the covering member 3 but a recess portion in which a hole or groove is formed with respect to the upper surface of the covering member 3 provided on substantially the same plane as the light emitting surface of the light emitting element 1 (for example, a depth of approximately 30 to 70 µm, and more preferably, approximately 50 µm). In order to perfectly fit (in contact with) the light-transmissive member 5 in the comparatively deep recess portion, it is necessary to use a flexible light-transmissive member which can easily be deformed or to form, on the light-transmissive member, such a convex portion as to be fitted in (in contact with) the recess portion. Since the recess portion has the adhesive layer 6a, however, both of the members can easily be bonded to each other so that adhesion can be ensured.

A thickness of the adhesive layer can be adjusted by the recess portion 4. In detail, in the case in which the adhesive layer is provided in only the recess portion and is bonded to the light-transmissive member, the peel-off of the light-transmissive member can be prevented and the light-transmissive member can directly cover the light emitting surface. Also in the case in which the adhesive layer is disposed on the upper surface of the light emitting element, an extra adhesive layer on the light emitting element is caused to flow to the recess portion by pressure generated when the light-transmissive member is disposed. Consequently, it is possible to enhance the adhesion of the light emitting element 1, the covering member 3 and the light-transmissive member 5 while a separation distance between the light emitting element 1 and the light-transmissive member 5 is being minimized. Accordingly, it is possible to obtain the thin light emitting device 700 capable of efficiently transmitting the light emitted from the light emitting element 1 or performing wavelength conversion over the emitted light.

From the foregoing, the recess portion 4 is preferably formed around the light emitting element 1 where the extra adhesive layer 6B on the upper surface of the light emitting element is allowed to flow easily and a light emitting quantity is large and deterioration is remarkable, particularly, along the light emitting element 1. Consequently, it is possible to efficiently enhance the adhesion of the components.

The recess portion 4 may be provided continuously as shown in FIG. 8A, may be divided or may be distributed unevenly. The light-transmissive member 5 does not need to be perfectly fitted in the recess portion 4. Therefore, the recess portion 4 can also be distributed unevenly in a complicated shape. In the case in which the adhesive layer is moved in the disposition of the light-transmissive member, which will be described later, it is possible to easily provide an adhesive in the recess portion regardless of the shape of the recess portion. However, it is necessary to provide the adhesive layer 6 in at least a part of the recess portion 4 in this embodiment. Therefore, it is preferable that a shape or arrangement is regular or cyclic shape because the adhesive layer 6 can easily be disposed.

The covering member 3 can be formed by a compression mold using a metal mold as described above. In some cases, a mold release sheet can be disposed between the metal mold and the light emitting element and covering member in order to easily demold the metal mold and the light emitting element and covering member. When the recess portion of the covering member is formed by utilizing the slack of the mold release sheet, the covering member and the recess portion can be formed at the same time, which is efficient. The method of forming the recess portion in the covering member by utilizing the slack of the mold release sheet is described above and thus not described here.

Figure 9:
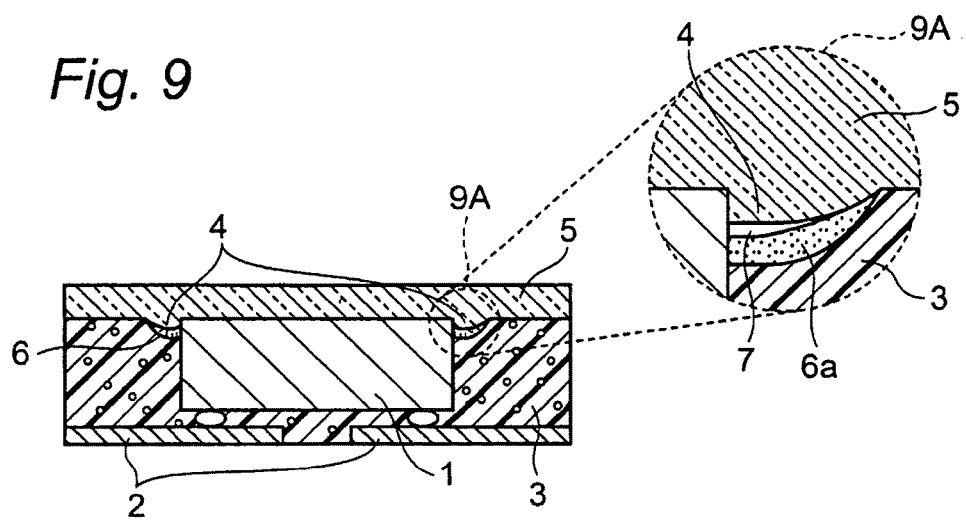
FIG. 9 is a sectional view showing an example in which a recess portion and an adhesive layer are different from those of FIG. 8B, and a partial enlarged view showing an area 9A including the recess portion and the adhesive layer.

As shown in FIG. 9, it is also possible to form the recess portion 4 having a side surface formed by a side surface of the light emitting element 1 and the covering member by the slack of the mold release sheet being pushed in a direction of the light emitting element of the covering member. With the recess portion 4, it is possible to enhance the adhesion of three members, that is, the light emitting element 1, the covering member 3 and the light-transmissive member 5 also in the case in which only the recess portion 4 has the adhesive layer 6, which is preferable. The recess portion can be formed in a desirable position or shape by a convex structure of an upper metal mold, etching, cutting, blast processing or the like in addition to the use of the slack of the mold release sheet.

In the fifth embodiment, one of the light emitting elements 1 taking a rectangular shape in a planar view can be used and the recess portion 4 can be provided in a shape of a circumferential groove along peripheral edges of all of four sides in the light emitting element 1. The recess portion provided along the light emitting element 1 indicates a state in which the recess portion 4 is provided in contact with the light emitting element 1 as seen on a plane shown in FIG. 8A. Since the recess portion 4 is provided along a whole peripheral edge of the light emitting element, the adhesion condition of the covering member 3 and the light-transmissive member 5 can be made uniform and light emitted from the light emitting element 1 can be transmitted uniformly. In the case in which the light-transmissive member 5 includes a phosphor, particularly, it is possible to prevent color unevenness of a luminescent color. Also in the case in which a plurality of light emitting elements is disposed, the shape and position of the recess portion 4 is not particularly restricted and the adhesive layer 6 can be preferably disposed on at least a part of the recess portion 4.

(Adhesive Layer)

In this embodiment, the adhesive layer 6 is provided in at least a part of the recess portion 4, and at least parts of the light-transmissive member 5 and the covering member 3 are bonded through the adhesive layer 6a in the recess portion 4 (for example, the adhesive layer 6 is disposed to cover at least a part of a surface of the recess portion 4 and at least a part of a surface of the light-transmissive member 5, and the recess portion 4 and the light-transmissive member 5 are provided in contact with each other through the adhesive layer 6a of the recess portion 4). As a material of the adhesive layer 6, it is preferable to use a light-transmissive resin which can effectively guide light emitted from the light emitting element 1 to the light-transmissive member side and can optically connect both of the members. In the case of the material has a lower refractive index than that of a material to be used as a substrate (a light emitting surface) of the light emitting element (for example, sapphire or the like), it is possible to enhance extraction of light. A resin to be used for each of the members, for example, a silicone resin can be preferably exemplified. The most preferable thing is that the adhesive layer 6 is not be disposed on the upper surface of the light emitting element or is formed thin in a minimum quantity, in order to maintain the thinness and the extraction efficiency of light from the light emitting device.

Figure 13A:
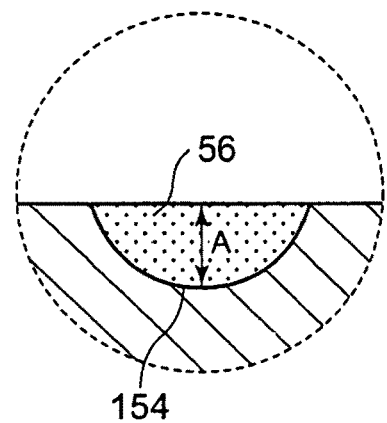
FIGS. 13A to 13E are partial enlarged views showing the vicinity of a recess portion and an adhesive layer in a light emitting device according to an embodiment of the present invention.
Figure 13B:
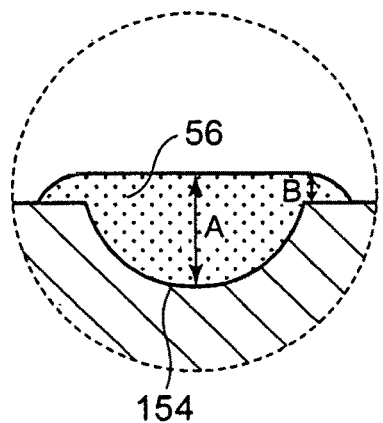

In the case in which an inner part of the recess portion is filled with the adhesive layer 6 (i.e. a lower surface of the light-transmissive member is an almost flat surface) as shown in FIG. 13A, at least the adhesive layer 6 on the open surface in the recess portion and the light-transmissive member 5 are preferably bonded to each other at least partially. In the case in which the adhesive layer 6 overflows the recess portion (i.e. the lower surface of the light-transmissive member has a recess shape) as shown in FIG. 13B, the upper surface of the adhesive layer 6 (specifically, an adhesive layer integrated with the adhesive layer in the recess portion) and the light-transmissive member 5 are preferably bonded to each other at least partially. In any case, the bonding is preferably carried out in order to enhance the adhesion of the light-transmissive member 5 and the covering member 3 through the adhesive layer 6.

Figure 10A:
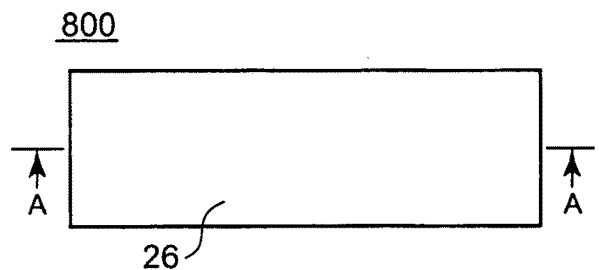
FIG. 10A is a plan view showing a light emitting device according to a sixth embodiment of the present invention, illustrating a state brought before a light-transmissive member is disposed.
Figure 13C:
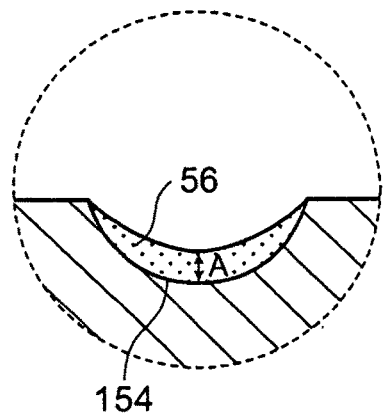
Figure 13D:
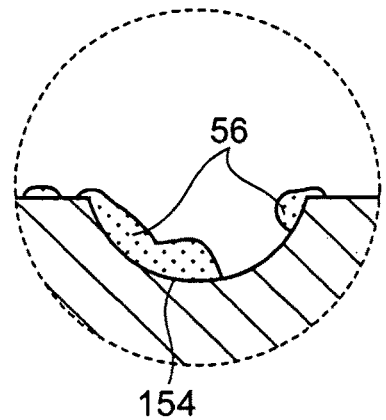

The adhesive layer 6*a* in the recess portion and the light-transmissive member 5 do not need to be always bonded to each other. An air gap 7 may be present as shown in area enlarged view of area 9A in FIG. 9 (for example, only a part of the surface of the Light-transmissive member 5 may come in contact with the adhesive layer 6*a* in the recess portion 4). Moreover, the adhesive layer 6 may be provided over the upper surface of the covering member 3 other than the light emitting element 1 and the recess portion 4 in addition to the recess portion 4. Consequently, the adhesion of the light emitting element 1 and the light-transmissive member 5 can be enhanced so that deterioration in the light-transmissive member 5 on the light emitting element can be relieved. A state in which the adhesive layer 6 is provided over the upper surface of the light emitting element indicates the case in which the adhesive layer 6*a* in the recess portion, and furthermore, the adhesive layer 6*b* are disposed on the upper surfaces of the light emitting element 1 therearound and the covering member 3 as shown in FIG. 8B or a state in which an adhesive layer is disposed over the whole upper surfaces of the light emitting element 1 and the covering member 3 as shown in FIG. 10A. The adhesive layer 6 does not need to be always formed integrally on an inside and an outside of the recess portion, and may be arranged in uneven division as shown in FIG. 13D.

If a wide area (for example, an area seen on a plane is approximately 50% or more) is covered or filled by the adhesive layer 6*a* of the recess portion, depending on a fitting property between the covering member and the light-transmissive member the recess portion can be adhered to the light-transmissive member 5 easily and reliably, which is preferable. When the recess portion provided along the light emitting element is filled with the adhesive layer, particularly, extraction efficiency of the light emitted from the light emitting element is high, which is preferable. Moreover, the adhesive layer may be properly provided between the other members or on an optical path.

In the case in which the adhesive layer 6 is provided in the recess portion 4 and on a portion other than the recess portion 4, the adhesive layer 6*a* of the recess portion may be formed to be thicker than the other portions. The thickness of the adhesive layer 6*a* of the recess portion is basically set to be a thickness of the adhesive layer from a bottom to an upper surface of the recess portion as shown in A of the enlarged view of area 8B in FIG. 8B or FIG. 13C. In the case in which an adhesive layer is divided in the recess portion or is formed in an uneven thickness as shown in FIG. 13D, at least a part is preferably formed more thickly than the adhesive layer other than the recess portion. The thickness of the adhesive layer on the upper surface of the light emitting element means a thickness of the adhesive layer from the light emitting surface to the upper surface of the light emitting element as shown in B of the enlarged view of area 8B in FIG. 8B. For example, if the thickness A of the adhesive layer 6*a* in the recess portion in the enlarged view of area 8B in FIG. 8B is set to be approximately 30 to 70 μm, the thickness B of the adhesive layer 6*b* on the upper surface of the light emitting element can form a thin film in a thickness of approximately 1 to 10 μm.

Figure 13E:
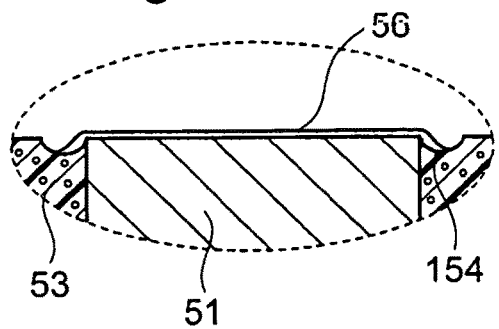

The adhesive layer can also be disposed as shown in FIG. 13E. That is, the adhesive layer 56 covers the most of the whole light emitting surface of a light emitting element 51 continuously from a part of a recess portion 154 provided along the light emitting element 51. In other words, the adhesive layer 56 can be integrally disposed in a transparent view of the finished light emitting device seen from the upper surface, and the area of the adhesive layer can be larger than the upper surface of the light emitting element 51. Since the light-transmissive adhesive layer can be disposed from the recess portion to at least a part of an end of the light emitting element, light emitted from the light emitting element 51 can be also discharged from the adhesive layer of the recess portion. In the lighting emitting device using the light reflective covering member 53, accordingly, a light emitting region of the light emitting device may be artificially enlarged as compared with the case in which the adhesive layer is not disposed across the light emitting element or the adhesive layer of the recess portion and the adhesive layer provided across the light emitting element are divided from each other.

The adhesive layer 6 may be formed by previously adjusting a thickness (thick in the recess portion and thin on the upper surface of the covering member other than the recess portion) or may be formed by a pressure in the disposition of the light-transmissive member 5. The pressure in the disposition of the light-transmissive member 5 represents a pressure to be applied to the light emitting element and the covering member in the disposition of the light-transmissive member 5. By utilizing the pressure, the extra adhesive layer 6 on the upper surface of the covering member 3 other than the light emitting element 1 or the recess portion 4 is allowed to flow to the recess portion 4, or the adhesive layer 6 disposed in only the recess portion 4 is allowed to get up to the upper surface of the covering member 3 other than the light emitting element 1 and the recess portion by a convex shape of the lower surface of the light-transmissive member. By adjusting a rough application quantity and an application position of the adhesive layer, therefore, it is possible to adjust the thickness of the adhesive layer 6 simultaneously with the disposition of the light-transmissive member 5.

An adhesive layer coating method (forming method) can include discharge through a dispenser, a spin coating method through a spin coater and the like and is not particularly restricted. By the spin coater, a wide area can efficiently be coated. In some aspects of the present invention, however, it is necessary to adjust a coating quantity and a coating position of the adhesive layer 6 to some degree. Therefore, the discharge through the dispenser is also used preferably. Viscosity of a material for the adhesive layer is preferably lower, for example, approximately 10 to 1000 mPa·s. By reducing the viscosity, the coating can be carried out by using the spin coater, and furthermore, the extra adhesive layer 6 on the upper surface of the covering member 3 other than the light emitting element 1 and the recess portion 4 tends to flow to the recess portion 4.

(Light-transmissive Member)

A light emitting device 700 in FIGS. 8A and 8B includes a light-transmissive member 5 for transmitting at least a part of light from a light emitting element 1, on upper surfaces of the light emitting element 1 and a covering member 3. Although at least a part of the light-transmissive member 5 is bonded to the covering member 3 through an adhesive layer 6 of a recess portion 4, a portion which is not provided with the adhesive layer 6 directly covers the upper surfaces of the light emitting element 1 and the covering member 3 in this embodiment.

If an end face of the light-transmissive member 5 is placed on substantially the same plane as an end face of the covering member and a lower surface thereof is bonded to an adhesive layer 6a of the recess portion at least partially, the shape of the light-transmissive member 5 in this embodiment is not particularly restricted. If a shape of the light-transmissive member 5 partially enters the recess portion 4, that is, a downward convex shape is taken in a region provided in contact with an adhesive layer 6a of the recess portion, it can easily be bonded to the adhesive layer 6a of the recess portion, which is preferable. In the case in which the light-transmissive member takes a convex shape on a lower surface, moreover, the upper surface to be a back face thereof may be gently dented corresponding to the convex shape (that is, the lower surface of the light-transmissive member is deformed along the recess portion of the covering member and the adhesive layer when the light-transmissive member is laminated in a soft condition) as shown in the enlarged view of area 10B in FIG. 10B. If the recess portion of the covering member is set into a filling state with the adhesive layer, the lower surface of the light-transmissive member is almost flat and the emitted light is easily discharged uniformly, which is preferable.

In the case in which the light-transmissive member 5 is closer to the light emitting surface of the light emitting element 1 (the light-transmissive member directly covers the light emitting surface of the light emitting element), it is possible to obtain the thin light emitting device 700 having high light extraction efficiency. In the case in which the light-transmissive member 5 includes a wavelength converting member such as a phosphor as in the present embodiment, furthermore, the wavelength conversion can efficiently be carried out, which is preferable.

For the light-transmissive member 5, an inorganic material such as glass is preferable to an organic material such as a resin from a viewpoint of a heat resistance. In this embodiment, the light-transmissive member 5 can be in contact with the recess portion 4 of the covering member through the adhesive layer 6. Therefore, it is possible to use the light-transmissive member 5 which is comparatively hard (for example, a modulus of elasticity of approximately 10 MPa or more) and has a high heat resistance. In other words, a hard light-transmissive member having high reliability (for example, glass, ceramic or a sintered body of a phosphor which will be described below) is fitted in the recess portion with difficulty and has low viscosity. However, the adhesive layer 6 is provided in the recess portion. Therefore, it is possible to ensure adhesion to the covering member 3. For example, a lower surface of a desirable sintered body is processed to take such a shape that at least a part of the adhesive layer 6a of the recess portion is bonded, and is disposed on the upper surfaces of the light emitting element 1 and the covering member 3. Consequently, it is possible to obtain the light emitting device 700 having less aging deterioration and a long life.

(Method of Manufacturing Light Emitting Device)

Figure 11:
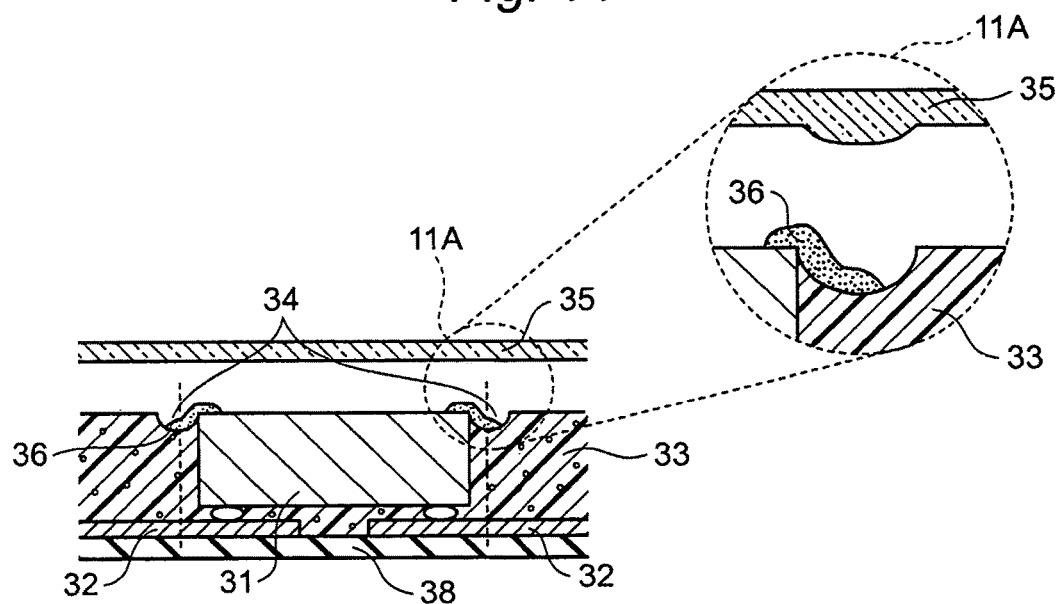
FIG. 11 is a schematic view showing a manufacturing process according to the fifth embodiment of the present invention and subfigure 11A is a partial enlarged view of an area including recess portion and an adhesive layer.

An example of a method of manufacturing the light emitting device 700 shown in FIGS. 8A and 8B will be described below with reference to FIG. 11. As shown in FIG. 11, a bump can be formed on a light emitting element 31 and the light emitting element 31 can be flip-chip mounted on a conductive wiring 32 on a support substrate through the bump. In this example, the light emitting element 31 can be arranged and mounted on a corresponding region to a single light emitting device 700 (the number of the light emitting elements 31 can be changed properly). The support substrate 38 can be removed in the manufacturing process.

(First Step)

In a first step, an upper surface of a covering member 33 is formed on substantially the same plane as a light emitting surface of the light emitting element 31 and a recess portion 34 is formed on the upper surface. Specifically, the covering member 33 is formed with a resin containing a light reflective particle by compression molding using a metal mold which includes interposition of the support substrate and the light emitting element mounted on the support substrate by using an upper metal mold disposed on the light emitting surface side of the light emitting element 31 and a lower metal mold disposed on a lower surface side of the support substrate.

When the metal mold is used as described above, a mold release sheet can be disposed in close contact with the upper metal mold. Consequently, an interference of the light emitting element and the metal mold can be relieved so that the metal mold and the member can easily be separated from each other. In addition, the mold release sheet is slackened in a direction of the covering member on a peripheral edge of the light emitting element by pressure in pressing. Consequently, the groove-shaped recess portion 34 can be formed along the light emitting element 31 simultaneously with the covering member 33. The recess portion 34 formed along the light emitting element 31 is preferable because the adhesive layer which is disposed on the upper surface of the light emitting element in a second step as described below and can be fluidized in a third step can be easily maintained. The slack of the mold release sheet is increased with a rise in the pressure in the pressing so that a deep recess portion can be formed. By utilizing the mold release sheet, it is possible to reduce a cost of the metal mold and to easily form the recess portion 34 along the light emitting element without damage of the light emitting element 31.

(Second Step)

In the second step, the adhesive layer 36 is disposed on at least a part of the recess portion 34 formed on the upper surface of the covering member 33. As long as the adhesive layer 36 is disposed in such a manner that the adhesive layer of the recess portion is bonded to the light-transmissive member 35 at least partially, the adhesive layer may be provided on the upper surfaces of the covering member and the light emitting element other than the recess portion or may be divided on an inside or outside of the recess portion. The adhesive layer of the light emitting device 700 according to the fifth embodiment can be finally formed continuously over the recess portion 34 and a part of the upper surfaces of the light emitting element and the covering member around the recess portion.

(Third Step)

In the third step, the light-transmissive member 35, that is, the comparatively hard light-transmissive member 35 containing the phosphor (for example, a modulus of elasticity of approximately 10 MPa or more) in this embodiment can be disposed on the upper surfaces of the light emitting element 31, the adhesive layer 36 and the covering member 33 so as to be bonded to the adhesive layer 36 of the recess portion 34 at least partially. When the flexible light-transmissive member is used, a part of the light-transmissive member can be deformed along the recess portion in some cases. As shown in the enlarged view of the area 11A in FIG. 11, when the light-transmissive member 35 having no flexibility is used, the light-transmissive member may be disposed after a lower surface thereof is previously processed to take a convex shape so as to be bonded to the adhesive layer 36 of the recess portion.

A part of the adhesive layer on the upper surface of the light emitting element, which is provided in the second step, can be fluidized and flowed to the recess portion 34 by pressure in the disposition of the light-transmissive member 35, and a part of the adhesive layer of the recess portion pressed by the light-transmissive member 35 (having the convex shape) can be caused to get up to the upper surface of the covering member other than the recess portion. Accordingly, the adhesive layer 36 in FIG. 11 provided in the second step can take such a shape as to be provided continuously from the recess portion 4 to the upper surfaces of the light emitting element 1 and the covering member 3 other than the recess portion therearound like the adhesive layer 6 in the enlarge view of area 8B in FIG. 8B after the disposition of the light-transmissive member. The thickness of the adhesive layer is the greatest in the recess portion (approximately 50 µm) and the thickness of the adhesive layer on the upper surfaces of the light emitting element and the covering member other than the recess portion is approximately 1 µm. In this case, transparency or wavelength conversion efficiency of the light emitted from the light emitting element is not reduced as compared with the case in which the covering member has no recess portion and a uniform adhesive layer having a thickness of approximately 50 µm is provided on the upper surfaces of the light emitting element and the covering member.

(Fourth Step)

Figure 12:
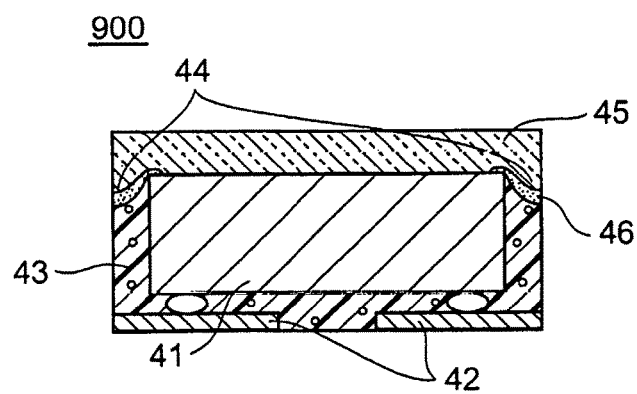
FIG. 12 is a sectional view showing the light emitting device in the case in which it is cut in a dotted line of FIG. 11A.

Finally, the support substrate 38 is peeled from the conductive wiring 32, and the end faces of the covering member 33 and the light-transmissive member 35 are adjusted in a desirable position and are subjected to dicing into individual pieces in such a manner that they are arranged on substantially the same plane. Consequently, it is possible to obtain the same light emitting device 700 as that of FIGS. 8A and 8B. A dicing position may be placed in the middle of the recess portion as shown in a dotted line of FIG. 11 in the case in which a mounting interval between the light emitting elements is small or the case in which the recess portion is separated from the light emitting element. In this case, a recess portion 44 is provided as shown in a light emitting device 900 of FIG. 12 and takes a cutting shape in the middle. When the recess portion is cut in the middle, an adhesive layer 46 is disposed on the end of the light emitting device. Therefore, it is possible to effectively prevent the peel-off of the light-transmissive member 45 from the end.

<Sixth Embodiment>

Figure 10B:
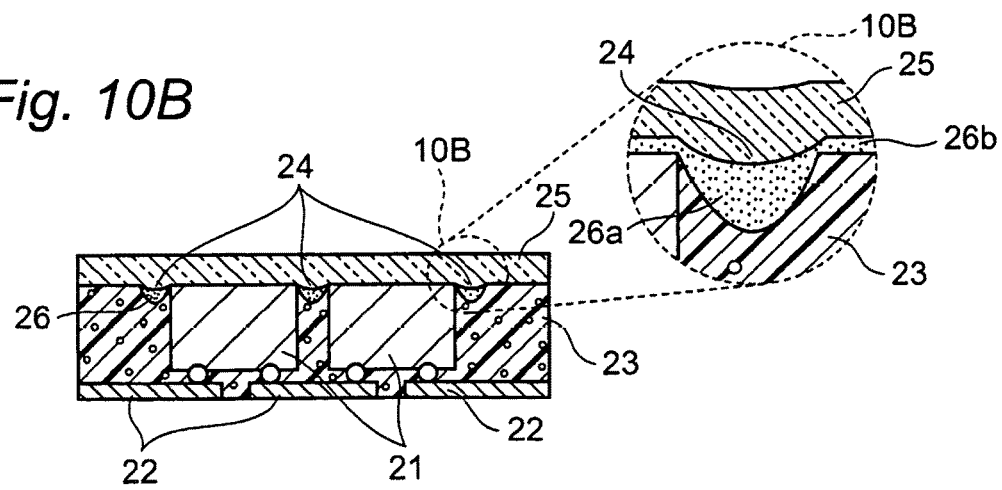
FIG. 10B is a sectional view showing an A-A section in FIG. 10A, and a partial enlarged view of an area 10B including a recess portion and an adhesive layer.

FIG. 10A is a plan view showing a light emitting device according to a sixth embodiment of the present invention and FIG. 10B is a sectional view showing an A-A section in FIG. 10A. A mounting substrate is a lead electrode 22 and a plurality of (two in the drawing) light emitting elements 21 is disposed. Furthermore, a recess portion 24 can be formed by a slack of the mold release sheet when a covering member is formed by using a metal mold and a mold release sheet, and the light emitting elements are disposed at a small interval (approximately 100 to 1000 µm). Consequently, the recess portion 24 is formed comparatively deeply (approximately 50 µm). Even if a light-transmissive member (for example, a thickness of approximately 50 µm and a modulus of elasticity of 1 MPa or less) to be a phosphor sheet including a YAG phosphor is disposed, it is difficult to fit a light-transmissive member 25 with the recess portion 24 with difficulty. Therefore, an adhesive layer 26 is formed in the recess portion 24 to ensure adhesion. The light-transmissive member 25 according to the sixth embodiment is comparatively soft and flexible. Therefore, an upper surface side of the light-transmissive member is gently dented along the recess portion of the covering member.

In this embodiment, the adhesive layer 26 is formed on most of the whole upper surfaces of the light emitting elements 21 and the covering member 23, and a thickness of an adhesive layer 26a of the recess portion is greater than that of an adhesive layer 26b on the upper surfaces of the light emitting element and the covering member other than the recess portion and is the greatest in the vicinity of a bottom face of the recess portion. The adhesive layer 26 can be formed by flowing to the recess portion 24 of at least a part of an adhesive layer 26b disposed in the adhesive layer formed over the whole upper surfaces of the light emitting element and the covering member by spin coating, other than the recess portion 24. The present embodiment can be substantially the same as the fifth embodiment except for the structure and forming method described above.

In a light emitting device 800 according to the sixth embodiment, the plurality of light emitting elements 21 is provided so that a luminous flux quantity is increased, and furthermore, a recess portion can be formed deeply by slack of a mold release sheet. Therefore, the adhesive layer can be held largely. In addition, the adhesive layer 26 provided over the whole upper surfaces of the light emitting element 21 and the covering member 23 can be formed comparatively easily by spin coating or the like, and a bonding area is wide so that excellent adhesion can be obtained. Since the light-transmissive member 25 has flexibility in disposition, it can easily be bonded to the adhesive layer 26a in the recess portion.

<First Example>

A process for forming the light emitting device 100 in a first example will be described below. First, a support substrate formed of a metal such as SUS is prepared and a resist is applied to perform exposure so that a resist having an opening portion is formed. Next, the opening portion is plated with a metal in a desirable thickness and the resist is then removed so that a pair of conductive wirings separated from each other (a thickness of approximately 30 to 100 µm, and particularly preferably, approximately 70 µm) is formed. For a plating method, it is possible to use electrolytic plating and electroless plating. By using the electrolytic plating, particularly, the resist can easily be removed and a shape of the conductive wiring is made uniform, which is preferable.

In the first example, an almost rectangular light emitting element (an emission wavelength of approximately 455 nm and a thickness of approximately 120 µm) taking a planar shape of approximately 0.8 mm by 0.3 mm is flip-chip mounted as the light emitting element on plural pairs of positive and negative electrodes separated from each other. A separation distance between the adjacent light emitting elements is approximately 1500 μm.

Subsequently, the support substrate having the light emitting elements mounted thereon is interposed into a metal mold including an upper metal mold and a lower metal mold and a covering member is formed by compression molding or the like. In this case, a mold release sheet is disposed to come in close contact with the upper metal mold and the covering member is then filled. The mold release sheet has a thickness of approximately 20 to 100 μm, and preferably, approximately 50 μm, and ETFE (a copolymer of tetrafluoroethylene ($C_2F_4$) and ethylene ($C_2H_4$)) is used in consideration of thermal durability, wettability, a low cost and the like. A heating temperature, a heating time or pressure through the metal mold, the thickness of the mold release sheet or the like can be properly adjusted depending on the composition of a resin to be used, a recess portion of a covering member to be desired, or the like.

In the first example, a covering member is formed. The covering member is constituted by a silicone resin containing, in a concentration of approximately 23% by weight, a light reflective material of $TiO_2$ particulate having a particle size of approximately 270 nm. The covering member is formed to cover the whole side surfaces of the light emitting element in a substantially equal thickness (approximately 120 μm) to the thickness of the light emitting element and a light emitting surface of the light emitting element is remained to be exposed. The covering member is also provided between a pair of electrodes and below the light emitting element. Moreover, a recess portion is provided along the light emitting element over the upper surface in a light emitting direction of the covering member by the slack of the mold release sheet. The slack is formed by pressing the mold release sheet in a region provided in contact with the light emitting element in pressing in a direction of the covering member containing a silicone resin as a base material. Therefore, the slack is formed almost simultaneously with the formation of the covering member. The recess portion is not a gentle curve over the surface of the covering member but takes a shape of a groove (a depth of approximately 50 μm and a width of approximately 100 μm or less).

Then, the exposed surface of the light emitting element and the upper surface of the covering member having the recess portion formed thereon are directly covered with a phosphor sheet (a thickness of approximately 50 μm) including a YAG phosphor which is a light-transmissive member. In the case in which the covering member is formed up to the light emitting surface of the light emitting element, the light-transmissive member may be disposed after the exposure of the light emitting surface by proper polishing or the like. The phosphor sheet is fitted in the recess portion of the covering member. The light-transmissive member does not need to take a shape of a sheet but can also be formed by a resin or the like using the metal mold. The support substrate is removed after the formation of the light-transmissive member. Subsequently, division into individual pieces is carried out by dicing in order to include a single light emitting element in a central part in a planar shape of approximately 2.2 mm by 0.5 mm. Thus, there is obtained an almost rectangular light emitting device 100 having a thickness of approximately 0.26 mm.

In the first example, it is possible to provide a light emitting device capable of producing almost the same advantages as those in the first embodiment.

<Second Example>

In a light emitting device 600 according to a second example shown in FIG. 7, a recess portion 64 of a covering member 63 is separated from a light emitting element 61, and a mounting substrate having a conductive wiring 62 on a support substrate 69 is provided. Moreover, a light-transmissive member 65 is formed by spraying and is fitted in a recess portion 64 of the covering member 63. Except for the foregoing, the light emitting device 600 has substantially the same structure as that of the first example. Explanation of the same structure will be omitted properly.

First, Cu plating is carried out in a desirable position on a ceramic support substrate (a thickness of approximately 500 μm) to form a pair of positive and negative conductive wirings (a thickness of approximately 50 μm). Then, the light emitting element 61 is flip-chip mounted on an upper surface of the substrate and a covering member 63 is provided by compression molding or the like using a metal mold in the same manner as in the first example.

At this time, a thinner mold release sheet (a thickness of approximately 30 μm) than the mold release sheet used in the first example is used, an interval between the light emitting elements is reduced (for example, a separation distance of approximately 300 μm) and the pressing pressure of the metal mold is increased. Thus, it is possible to form the recess portion 64 separated from the light emitting element 61. The recess portion 64 has an open surface separated from the light emitting element as seen in s planar view and takes an extended shape in a direction of the light emitting element from the open surface toward a bottom part.

Furthermore, a liquid silicone resin containing a YAG phosphor is sprayed onto the light emitting surface of the light emitting element and the upper surface of the covering member 63 having the recess portion 64 formed thereon. Consequently, the light-transmissive member 65 is formed. The recess portion 64 according to the present example has the open surface and the bottom part shifted from each other as seen in a sectional view (that is, in a sectional view of FIG. 7, positions of the open surface and the bottom part are different each other in a transverse direction (positions in a lateral direction) of the figure). For this reason, it is hard to fit the light-transmissive member 65 in the recess portion 64. However, the light-transmissive member 65 is fitted in the recess portion by spraying. An angle for the spraying or the number of spraying operations can be adjusted properly. When the spraying is carried out obliquely, the light-transmissive member can easily be formed in the recess portion, which is preferable. By carrying out the spraying plural times, it is possible to laminate the light-transmissive member in a desirable thickness and to carry out adjustment into different thicknesses in respective places. Furthermore, it is also possible to laminate a resin containing different types of phosphors.

Finally, division into individual pieces is performed by dicing in the same manner as in the first example. Thus, the light emitting device 600 is obtained.

<Third Example>

A process for forming a light emitting device 800 according to a third example will be described below. First, there is prepared a lead frame configuring plural pairs of positive and negative lead electrodes. Herein, there is used a lead frame constituted by a Cu alloy containing Cu as a main component.

In the third example, an almost rectangular light emitting element (an emission wavelength of approximately 455 nm and a thickness of approximately 120 μm) taking a planar shape of approximately 0.8 mm by 0.3 mm is flip-chip mounted as the light emitting element 1 on plural pairs of positive and negative electrodes separated from each other.

Subsequently, the lead frame having the light emitting elements mounted thereon is interposed into a metal mold including an upper metal mold and a lower metal mold and a covering member 3 is formed by compression molding or the like. In this process, a mold release sheet is disposed to come in close contact with the upper metal mold and the covering member is then filled. The mold release sheet has a thickness of approximately 50 to 100 μm, and ETFE (a copolymer of tetrafluoroethylene ($C_2F_4$) and ethylene ($C_2H_4$)) is used in consideration of thermal durability, wettability, a low cost and the like. A heating temperature, a heating time or pressure through the metal mold, the thickness of the mold release sheet or the like can be properly adjusted depending on the composition of a resin to be used, a recess portion of the covering member to be desired, or the like.

In the third example, the covering member is formed. The covering member is constituted by a silicone resin containing, in a concentration of approximately 23% by weight, a light reflective material of $TiO_2$ particulate having a particle size of approximately 270 nm. The covering member is formed to cover the whole side surfaces of the light emitting element 1 in a substantially equal height (approximately 120 μm) to the height of the light emitting element 1 and a light emitting surface of the light emitting element is remained to be exposed. The covering member is also provided between a pair of electrodes and below the light emitting element. Moreover, a recess portion 4 is provided along the light emitting element 1 by the slack of the mold release sheet deformed to a region where the covering member is formed by pressing of the metal mold over the upper surface in a light emitting direction of the covering member. Specifically, the mold release sheet in a region provided in contact with the light emitting element approaches a space which is not filled with the covering member containing a silicone resin as a base material so that the slack takes a convex shape, and a recess portion is formed simultaneously with the filling of the covering member. The recess portion is not a gentle curve over the surface of the covering member but takes a shape of a groove (a depth of approximately 50 μm and a width of approximately 100 μm or less) and is provided along a whole peripheral edge of the light emitting element.

Next, the silicone resin is applied onto the recess portion 4 thus formed and the upper surface of the light emitting element therearound by means of a dispenser and an adhesive layer 6 is disposed. Subsequently, the exposed surface of the light emitting element 1 and the upper surfaces of the adhesive layer 6 and the covering member 3 are covered with glass (a thickness of approximately 150 μm) containing a YAG phosphor to be a light-transmissive member 5. By pressure in the disposition of the light-transmissive member 5, a part of the adhesive layer on the upper surface of the light emitting element flows to the recess portion 4, and a part of the adhesive layer of the recess portion gets up to the upper surface of the covering member 3 other than the recess portion. Finally, the adhesive layer 6 is continuously formed in the recess portion 4, the light emitting element 1 around the recess portion, and the upper surface of the covering member 3. A thickness of the adhesive layer of the recess portion 4 is greater than that of the adhesive layer on the light emitting element 1 and that of the adhesive layer on the upper surface of the covering member other than the recess portion, and a thickness of the adhesive layer of the recess portion is approximately 50 μm and a thickness of the adhesive layer on the upper surface of the light emitting element is approximately 1 μm. Subsequently, the adhesive layer is thermally cured by using an oven or the like to securely fix the covering member to the light-transmissive member.

Then, division into individual pieces is carried out by dicing in order to include a single light emitting element in a central part in a planar shape of approximately 2.2 mm by 0.5 mm. Thus, there is obtained an almost rectangular light emitting device 800 having a thickness of approximately 0.36 mm.

A light emitting device according to the embodiments of the present invention can be preferably utilized in an illuminating light source, a backlight source for an LED display and a liquid crystal display device, a signal, an illumination type switch, various sensors, various indicators and the like.

What is claimed is:

1. A light emitting device comprising:
   a light emitting element;
   a covering member for covering a side surface of the light emitting element; and
   a light-transmissive member disposed on upper surfaces in a light emitting direction of the light emitting element and the covering member, the light-transmissive member having an end face on substantially the same plane as an end face of the covering member, wherein:
   the covering member has a recess portion or a convex portion on an upper surface thereof,
   in a top view, the recess portion or the convex portion surrounds the light emitting element, and a portion of the covering member other than the recess portion or the convex portion is located outside of the recess portion or the convex portion,
   a vertical distance between (i) a plane of a light emitting surface of the light emitting element and (ii) a plane of the upper surface of the covering member at the portion of the covering member other than the recess portion or the convex portion, is less than 50 μm, and
   the light-transmissive member is provided in contact with the recess portion or the convex portion.

2. The light emitting device according to claim 1, wherein the recess portion or the convex portion extends along the light emitting element.

3. The light emitting device according to claim 1, wherein the recess portion or the convex portion is separated from the light emitting element.

4. The light emitting device according to claim 1, wherein the covering member is a resin containing a light reflective material.

5. The light emitting device according to claim 1, wherein the light-transmissive member contains a phosphor.

6. A light emitting device comprising:
   a light emitting element;
   a covering member for covering a side surface of the light emitting element, a light emitting surface of the light emitting element being exposed;
   a light-transmissive member disposed on upper surfaces in a light emitting direction of the light emitting element and the covering member, the light-transmissive member having an end face on substantially the same plane as an end face of the covering member; and
   an adhesive layer for bonding the covering member to the light-transmissive member, wherein:
   the covering member has a recess portion on an upper surface thereof, the adhesive layer is provided in at least the recess portion, and at least parts of the light-transmissive member and the covering member are bonded to each other through the adhesive layer of the recess portion.

7. The light emitting device according to claim 6, wherein the adhesive layer is disposed over the upper surface of the light emitting element, and a thickness of the adhesive layer of the recess portion is greater than that of the adhesive layer on the upper surface of the light emitting element.

8. The light emitting device according to claim 6, wherein the light-transmissive member contains a phosphor.

9. The light emitting device according to claim 6, wherein the light-transmissive member is disposed in the recess portion.

10. The light emitting device according to claim 6, wherein the light-transmissive member has a lower surface which is substantially a flat surface.

11. The light emitting device according to claim 6, wherein the recess portion is provided along the light emitting element.

12. A method of manufacturing a light emitting device including a light emitting element, a covering member for covering a side surface of the light emitting element, and a light-transmissive member disposed on upper surfaces in a light emitting direction of the light emitting element and the covering member, the method comprising:

a first step comprising:
forming the upper surface of the covering member, and
forming a recess portion or a convex portion on the upper surface of the covering member,
wherein, in a top view, the recess portion or the convex portion surrounds the light emitting element, and a portion of the covering member other than the recess portion or the convex portion is located outside of the recess portion or the convex portion, and
wherein a vertical distance between (i) a plane of a light emitting surface of the light emitting element and (ii) a plane of the upper surface of the covering member at the portion of the covering member other than the recess portion or the convex portion, is less than 50 μm;

a second step comprising forming the light-transmissive member in contact with the recess portion or the convex portion; and a third step comprising cutting end faces of the covering member and the light-transmissive member so as to be arranged on substantially the same plane.

13. The method of manufacturing a light emitting device according to claim 12, wherein the recess portion or the convex portion is formed along the light emitting element.

14. The method of manufacturing a light emitting device according to claim 12, wherein the recess portion or the convex portion is formed apart from the light emitting element.

15. The method of manufacturing a light emitting device according to claim 12, wherein the covering member is formed of a resin containing a light reflective material in the first step.

16. The method of manufacturing a light emitting device according to claim 12, wherein the light-transmissive member contains a phosphor in the second step.

17. The method of manufacturing a light emitting device according to claim 12, wherein a metal mold is used in the first step.

18. The method of manufacturing a light emitting device according to claim 17, wherein a mold release sheet is used in the first step.

19. The method of manufacturing a light emitting device according to claim 12, wherein the recess portion or the convex portion is formed by using a metal mold and a mold release sheet through slack or swelling of the mold release sheet.

20. A method of manufacturing a light emitting device including a light emitting element, a covering member for covering a side surface of the light emitting element, a light-transmissive member disposed on upper surfaces in a light emitting direction of the light emitting element and the covering member, and an adhesive layer for bonding the covering member to the light-transmissive member, the method comprising:

a first step comprising:
forming the upper surface of the covering member such that a vertical distance between (i) a plane of a light emitting surface of the light emitting element and (ii) a plane of the upper surface of the covering member, is less than 50 μm, and
forming a recess portion on the upper surface of the covering member;

a second step comprising disposing the adhesive layer in at least the recess portion;

a third step comprising forming the light-transmissive member in such a manner that at least a part thereof is bonded to the adhesive layer of the recess portion; and a fourth step comprising cutting end faces of the covering member and the light-transmissive member so as to be arranged on substantially the same plane.

21. The method of manufacturing a light emitting device according to claim 20, wherein the adhesive layer of the recess portion is formed to be thicker than the adhesive layer on the upper surface of the light emitting element in the recess portion.

22. The method of manufacturing a light emitting device according to claim 20, wherein the light-transmissive member is previously processed into such a shape that at least a part thereof is possible to be provided in contact with the adhesive layer of the recess portion and is then disposed in the third step.

* * * * *